United States Patent
Vidal et al.

(10) Patent No.: US 8,634,450 B2
(45) Date of Patent: Jan. 21, 2014

(54) ADAPTIVE ERROR CORRECTING CODE FOR DATA COMMUNICATIONS OVER A PLASTIC OPTICAL FIBRE

(75) Inventors: Carlos Pardo Vidal, Tres Cantos (ES); Rúben Pérez de Aranda Alonso, Tres Cantos (ES)

(73) Assignee: Knowledge Development for POF, S.L., Madrid (ES)

(*) Notice: Subject to any disclaimer, the term of this patent is extended or adjusted under 35 U.S.C. 154(b) by 0 days.

(21) Appl. No.: 13/410,614

(22) Filed: Mar. 2, 2012

(65) Prior Publication Data

US 2012/0250785 A1  Oct. 4, 2012

(30) Foreign Application Priority Data

Mar. 11, 2011 (EP) .................................. 11002046

(51) Int. Cl.
*H04B 1/38* (2006.01)

(52) U.S. Cl.
USPC ........... 375/222; 375/220; 375/279; 375/295; 375/308; 375/316; 375/329; 455/39; 455/91; 455/130; 455/324; 714/746; 714/774

(58) Field of Classification Search
USPC ......... 375/220, 222, 279, 295, 308, 316, 329; 455/39, 91, 130, 324; 714/746, 774
See application file for complete search history.

(56) References Cited

FOREIGN PATENT DOCUMENTS

WO    2004098067    11/2004

OTHER PUBLICATIONS

Deng R H et al., "DC-Free Coset Codes", IEEE Transactions on Information Theory, IEEE Press, USA, vol. 34, No. 4, Jul. 1, 1988, pp. 786-792, XP000000573, ISSN: 0018-9448, DOI: 10.1109/18.9775.

Forney D G Jr. et al., "Sphere-Bound-Achieving Coset Codes and Multilevel Coset Codes", IEEE Transactions on Information Theory, IEEE Press, USA, vol. 46, No. 3, May 1, 2000, XP011027619, ISSN: 0018-9448.

MA S-C: "Bandwidth efficient concatenated coding schemes", IET Communications, vol. 4, No. 1, Jan. 5, 2010, pp. 26-31, XP006034524, ISSN: 1751-8636, DOI: 10.1049/IET-COM:20090022.

European Search Report dated Sep. 14, 2011 in European Application No. 11002046.8.

European Communication dated Dec. 5, 2012 in European Patent Application No. 11002046.8-2415/3498432, enclosing Third Party Observations.

Carlos Pardo et al., "KDPOF, The Path to Gigabit POF", Program of Conference "19th International Conference on Plastic Optical Fibers (POF 2010)", Yokohama, Japan, Oct. 19-21, 2010.

*Primary Examiner* — Leon Flores

(74) *Attorney, Agent, or Firm* — Plumsea Law Group, LLC

(57) ABSTRACT

An efficient coding and modulation system for transmission of digital data over plastic optical fibers is disclosed. The digital signal is coded by a three-level coset coding. The spectral efficiency of the system is configurable by selecting the number of bits to be processed in each of the levels. The first level applies to the digital data a binary BCH coding and performs coset partitioning by constellation mapping and lattice transformations. Similarly, second level applies another binary BCH coding, which may be performed selectably in accordance with the desired configuration by two BCH codes with substantially the same coding rate, operating on codewords of different sizes. The third level is uncoded. The second and third levels undergo mapping and lattice transformation. After an addition of the levels, a second-stage lattice transformation is performed to obtain a zero-mean constellation. The symbols output from such three-level coset coder are then further modulated.

15 Claims, 26 Drawing Sheets

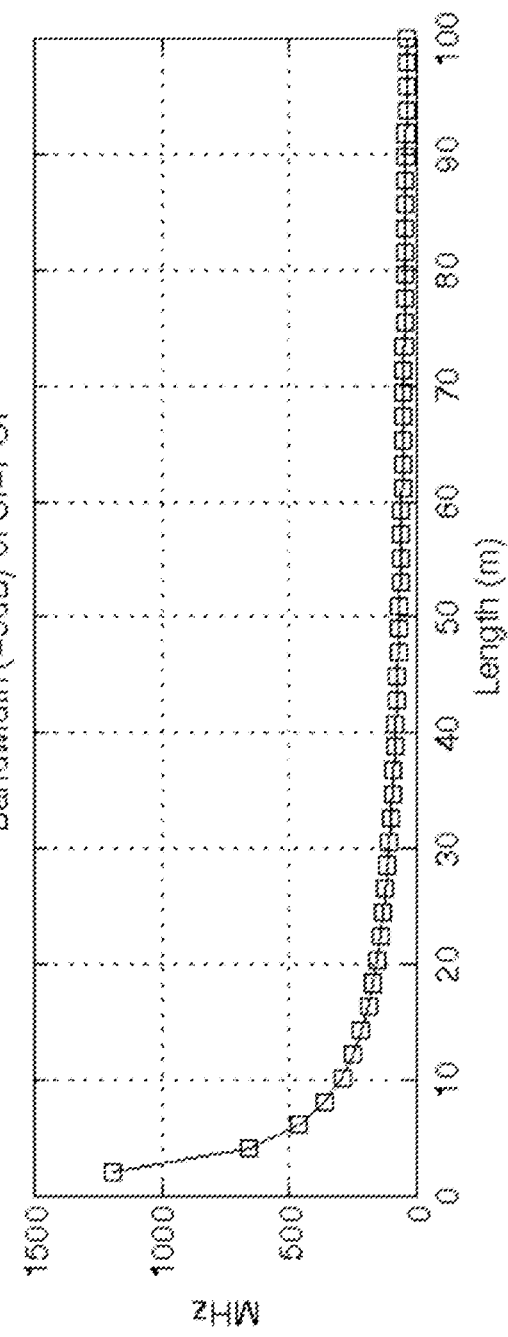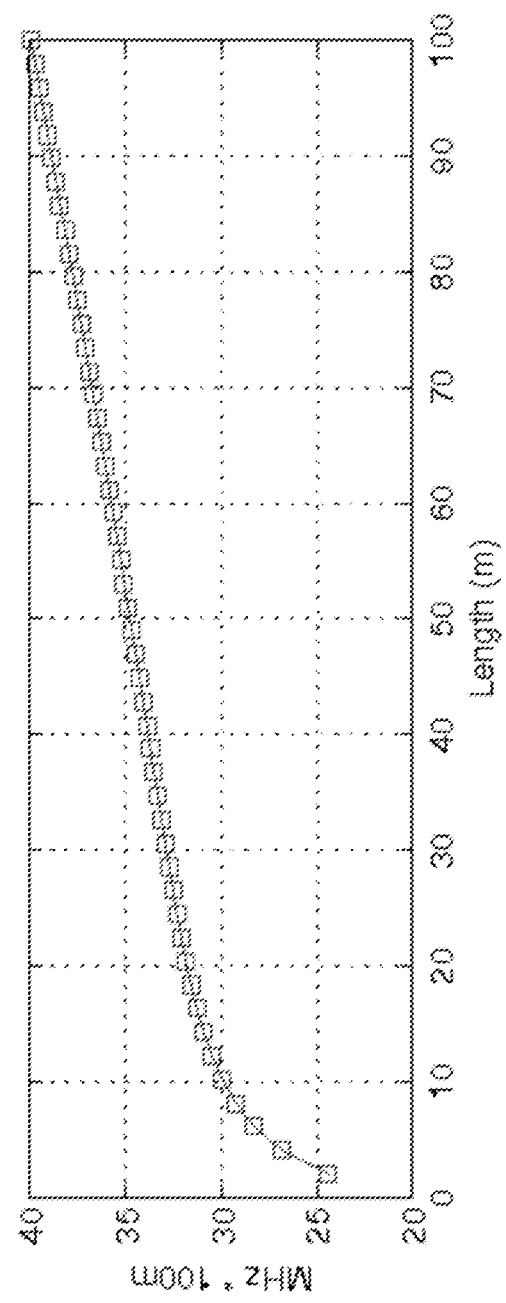
Fig. 2A
Fig. 2B

Fig. 17

| $N_{MLCC}$ (1D symbols) | α (bits/ codeword) | β(1) (bits/ codeword) | β(2) (bits/ codeword) | β(3) (bits/ codeword) | η (bits/s/Hz/dim) | M-PAM | $n_b(1)$ (bits/dim) | $n_b(2)$ (bits/dim) | $n_b(3)$ (bits/dim) |
|---|---|---|---|---|---|---|---|---|---|
| 2044 | 1637 | 1637 | 0 | 0 | 0,8 | 2 | 1 | 0 | 0 |
| 2044 | 2637 | 1637 | 1000 | 0 | 1,3 | 4 | 1 | 0,5 | 0 |
| 2044 | 3659 | 1637 | 2022 | 0 | 1,8 | 4 | 1 | 1 | 0 |
| 2044 | 4681 | 1637 | 2022 | 1022 | 2,3 | 8 | 1 | 1 | 0,5 |
| 2044 | 5703 | 1637 | 2022 | 2044 | 2,8 | 8 | 1 | 1 | 1 |
| 2044 | 6725 | 1637 | 2022 | 3066 | 3,3 | 16 | 1 | 1 | 1,5 |
| 2044 | 7747 | 1637 | 2022 | 4088 | 3,8 | 16 | 1 | 1 | 2,0 |
| 2044 | 8769 | 1637 | 2022 | 5110 | 4,3 | 32 | 1 | 1 | 2,5 |
| 2044 | 9791 | 1637 | 2022 | 6132 | 4,8 | 32 | 1 | 1 | 3,0 |
| 2044 | 10813 | 1637 | 2022 | 7154 | 5,3 | 64 | 1 | 1 | 3,5 |
| 2044 | 11835 | 1637 | 2022 | 8176 | 5,8 | 64 | 1 | 1 | 4,0 |
| 2044 | 12857 | 1637 | 2022 | 9198 | 6,3 | 128 | 1 | 1 | 4,5 |
| 2044 | 13879 | 1637 | 2022 | 10220 | 6,8 | 128 | 1 | 1 | 5,0 |
| 2044 | 14901 | 1637 | 2022 | 11242 | 7,3 | 256 | 1 | 1 | 5,5 |
| 2044 | 15923 | 1637 | 2022 | 12264 | 7,8 | 256 | 1 | 1 | 6,0 |

ADAPTIVE ERROR CORRECTING CODE FOR DATA COMMUNICATIONS OVER A PLASTIC OPTICAL FIBRE

The present invention relates to a transmission of data over a plastic optical fibre. In particular, the present invention relates to a method and an apparatus for transmitting and receiving data over a plastic optical fibre using an adaptive error-correcting code and modulation scheme.

BACKGROUND OF THE INVENTION

Today's communications systems utilize various types of cable and radio interfaces. The most reliable are glass optical fibres which also enable very high transmission rates. On the other hands, copper cables still form part of the telephone lines which are also used for transmission of data. Especially in the last decades, wireless communications developed rapidly. All these data transport media have their own characteristics and are suitable for deployment in different scenarios and architectures.

Glass optical fibres (GOF) are used nowadays especially for communication requiring a very high bandwidth and very low attenuation. Since glass optical fibres have very small diameters and low numerical apertures (NA) its installation requires special and expensive connector tools and skilled installation workers.

Another possibility is the deployment of plastic optical fibres (POF), for instance, based on polymethacrylate (PMMA) with a larger core diameter (about 1 mm) and a high numerical aperture (NA of approximately 0.3 to 0.5). The least expensive and most used plastic optical fibre is an SI-POF with a numerical aperture of 0.5. However, there is also an SI-POF with a low numerical aperture of 0.3 enabling higher data rates as well as PMMA GI-POF with a bandwidth length product near to 1 GHz×100 meter. PMMA has several attenuation windows that enable POF to be used with different visible light sources from blue to red Light Emitting Diodes (LED) or red Lasers Diodes (LD).

In comparison with GOF, plastic optical fibres have an advantage of a very easy installation. They can be deployed by professional or non-professional installation workers using basic tools such as scissors or cutters and inexpensive plastic connectors. It is resilient to misalignment and strong vibrations so it can be installed in industrial and automotive environments without loss of communication capacity. The POF connections have also much higher tolerance to residual dust on the terminal faces than GOF, due to the larger core diameter.

Since the transmission over POF is optic, plastic optical fibres are completely immune to electrical noise. Thus, the existing copper wiring will not interfere with data passing through plastic optical fibres so it can even be installed next to electrical cabling. Plastic optical fibre connectors and opto-electronics for POF are mainly low cost consumer parts which enable installation workers to save cable costs and installation, testing, and maintenance time. Plastic optical fibres have been widely employed, in particular, for infotainment networks in cars and can now be seen as a global standard for high-speed on-board car networks such as Media Oriented Systems Transport (MOST).

FIG. 1 illustrates an example of a system for transmission and reception of data over POF. The transmission over plastic optical fibres is based on a light intensity modulation with direct detection. The signal to be transmitted is generated from a digital circuit 110 for encoding and modulating the user bit stream information and passed to a transmitter (Tx) analogue front end (AFE) 120 for conversion of digital data into an electrical signal for controlling the light emitting element 130. After this conversion of the electric signal to an optical signal, the latter is then input to the optical fibre 150. Electrical optical converters used for plastic optical fibres are typically light-emitting diodes (LED) characterized by properties such as a peak wavelength, a wavelength width or launching modal distribution.

During the transmission of the signal via plastic optical fibres 150, the light is affected by severe attenuation as well as distortion mainly due to modal dispersion. The modal dispersion is caused by different modes of light propagating in the fibre on different paths and with different speeds and attenuations, resulting in different arrival times at the receiver. The optical signal is also affected by a so-called mode coupling where the energy of higher order modes is transferred to lower order modes and vice versa. As a consequence, an optical pulse is broadened which leads to lower the signal bandwidth.

At a receiver, the optical signal from the plastic optical fibre 150 is converted into electrical intensity by means of an opto-electric converter 170 such as a photodiode. Then, the electrical signal is processed by the analogue front end (AFE) 180. In particular, it is amplified, inter alia by a trans-impedance amplifier (TIA) and connected to a digital receiver 190. The TIA is typically the most important noise source which limits the final sensitivity of the communication system.

Regarding the data transmission technology, GOF have been successfully using a non-return-to-zero (NRZ) modulation. In particular, current glass fibre communication systems mainly utilize NRZ 8b/10b or NRZI 4b/5b line coding which requires a baud rate of 1.25 GHz and 125 MHz for 1 Gbps and 100 Mbps solutions, respectively. Current plastic optical fibre solutions thus also adopted NRZ modulation for data communications. However, plastic optical fibres have a frequency and time response different from that of glass fibres and also have considerably higher attenuation. As a communication medium, plastic optical fibres show a very high modal dispersion due to its important differential mode delay and differential mode attenuation. The large area photodiodes required for coupling with a fibre typically have a limited bandwidth. In view of a plastic optical fibre frequency response, solutions supporting 100 or 150 Mbps are possible up to ca. 50 meters; however, 1 Gbps does not seem to be achievable without a more advanced technology.

FIG. 2A shows a variation of POF optical bandwidth (y axis, in MHz) as a function of the fibre length (x axis, in meters). FIG. 2B shows the variation of the bandwidth-length product (y axis, in MHz·100 m) as a function of the fibre length. Here, the fibre is an SI-POF with a numerical aperture NA of 0.5 (in particular, model Mitsubishi Eska-GH4001), and the light source is an RCLED with launching condition FWHN NA of 0.31, wavelength peak of 658 nanometers and an FWHN wavelength width of 21 nanometers. As can be seen from FIG. 1, a suitable flat response for a desired 1.25 GHz baud rate is only possible in the very first meters of the plastic optical fibre. For a laser light source, the optical bandwidth as a function of length is very similar. Therefore, the bandwidth bottleneck is produced by plastic optical fibres independently on how fast the light source is because the limiting factor is, in particular, the modal dispersion by mode coupling in the fibre.

SUMMARY OF THE INVENTION

In view of the above mentioned limitations of plastic optical fibre, the aim of the present invention is to provide an efficient and adaptive transmission system based on plastic optical fibres.

This is achieved by the features of the independent claims.

Further advantageous embodiments are put forward in the dependent claims.

Employing the plastic optical fibre provides many advantages. In particular, with respect to wireless and electric transmission media, POF are resilient against electro-magnetic interference. In comparison with glass optical fibre, POF enables easier installation, is less expensive and provide higher robustness with respect to connections. The present invention exploits the advantages of POF and provides an adaptive system which enables a high data-rate communication over POF.

It is the particular approach of the present invention to transmit data over POF coded by a three-level coset code, wherein the first level includes BCH coding, the second level includes BCH coding with a higher coderate than the first level, and all three levels include respective mapping to a constellation and lattice transformation of the mapped symbols. The levels are then added and the resulting coded symbols are mapped onto a time-domain modulation. The second level provides two selectable BCH codes with substantially the same coderate and different codewordlength.

In accordance with an aspect of the present invention a method is provided for coding digital data for transmission over a plastic optical fibre. The method comprises the steps of: coding input digital data by a three-level coset coding and modulating the symbols encoded with the three-level coset coding using a time-domain modulation. Moreover, the three-level coset coding includes the steps of separating from the input digital data a first portion, a second portion and a third portion of data with a respective amounts of bits; coding the first portion of data with a first BCH code in a first level and coding the second portion with either a second or a third BCH code in a second level, wherein the third BCH code has a codeword length lower than the codeword length of the first and the second BCH code and the third BCH code has substantially same coderate as the second BCH code. In the first level a step of mapping the coded first portion onto symbols of a first predefined constellation is performed as well as a lattice transformation of the mapped symbols so as to achieve coset partitioning. In the second level a step of mapping the coded second portion onto symbols of a second predefined constellation is performed depending on whether second or third BCH code was used as well as a lattice transformation of the mapped symbols so as to achieve coset partitioning. In the third level a step of mapping the third portion onto symbols of a third predefined constellation is performed as well as a lattice transformation of the mapped symbols so as to achieve coset partitioning. Then, a step of adding the transformed symbols from the first, second and third level is applied.

In accordance with another aspect of the present invention, a method is provided for decoding a digital signal encoded with a three-level coset coder and received via a plastic optical fibre, the method comprising the steps of: demodulating the encoded digital signal with a time-domain modulation to obtain symbol codewords and transforming them with an inverse lattice transformation, decoding the demodulated and transformed symbols with a three-stage decoder including the steps of: extracting a first portion of a codeword by applying inverse lattice transformation and a modulo operation to a demodulated symbol; decoding in a first stage the first portion with a first BCH decoder and based on the decoded first portion selecting a first coset; extracting a second portion by applying inverse lattice transformation and a modulo operation to a symbol obtained by subtracting the decoded first portion from the demodulated symbol; decoding in a second stage the second portion with a second or a third BCH decoder and based on the decoded second portion select a second coset; obtaining a third portion by subtracting the decoded first and second cosets from the demodulated symbol and by applying inverse lattice transformation and a modulo operation; and multiplexing the decoded first, second and third portion, wherein on the second stage the second BCH code and the third BCH code are provided, wherein the third BCH code has a codeword length lower than the codeword length of the first and the second BCH code, and the third BCH code has substantially same coderate as the second BCH code.

The plastic optical fibre here is any commercially available optical fibre made of plastics. The present invention relates to a digital processing to be performed at the transmitter before the signal is converted to analogue values to control a light emitting element for generating the optical signal injected into POF and/or at the receiver after the optical signal has been detected by a photo-electric element.

The three-level coset coding is a multi-level coset coding which provides a multi-dimensional constellation in which the bits that select between cosets of the first level are better coded than the bits selecting between cosets of the second level and/or the constellation points. The bits selecting a coset are better protected than the bits specifying the constellation point. The bits selecting the coset on a lower level are better protected than the bits selecting a coset on a higher level of the multi-level coset code.

Adaptability to possible changes of the channel conditions is provided by the possibility of defining/selecting the number of bits in the three data partitions, for instance, from among predefined valid configurations supported by the employed coding, mapping, lattice transformation, and number of time-domain modulation states. In addition, selectability of either the second or the third BCH code in the second level provides even finer possibility to achieve desired spectral efficiency, especially lower spectral efficiencies.

Advantageously, the method of the present invention further comprises a step of selecting in the second level the second or the third BCH code based on, for instance, channel conditions. The selection of the processing to be performed on the second level must be carried out synchronously at the transmitter and at the receiver. This may be achieved, for instance, by defining a suitable protocol for a message exchange between the transmitter and receiver and/or rules/conditions for switching. In the same way, the selection of number of bits input to the respective levels may be configured. The number of bits in the second and/or the third levels may be zero for some configurations.

In general, an adaptive algorithm for spectral efficiency of the three-level coset coder may be established based on the signal to noise ratio (SNR) or reception quality measured at the receiver (such as bit error rate, block error rate, or any other measure for quality). The receiver may then feed this information to the transmitter. This is advantageously performed by employing physical layer headers (or a portions of such headers) defined for this purpose and transmitted through a feedback channel. However, the present invention is not limited thereto and any mechanism for switching may be employed. For instance, the receiver may measure a quality indicator as exemplified above, and based thereon estimate an appropriate encoder configuration, which is then signaled to the transmitter. The feed-back channel may be provided within packet headers of the physical layer packets, or, alternatively, in packets dedicated to such feed-back channel. The quality indication may be sent regularly in predefined time periods/on predefined time instances, or may be sent irregularly as soon as a change in coder settings is required, for instance, due to a change in channel quality.

According to this information (quality indication) the transmitter may then switch the MLCC configuration, and signal the switching to the receiver by encoding a corresponding indication within the physical layer header. The change of configuration is in this way synchronized by means of signaling it within a header to guarantee that the receiver will be able to always properly decode the data. On the other hand, the header preferably uses a fixed MLCC encoding scheme configured with the lowest spectral efficiency, so that the header may be robustly decoded under any noise and distortion conditions, for which the system has been designed. However, the above described switching mechanism is only an example, and the present invention may also work with other switching mechanisms.

Preferably, the second and the third binary BCH codes have same primitive polynomial. This enables using same second-level implementation for both the second and the third code.

In accordance with an advantageous embodiment of the present invention, the first BCH coder generates codewords with 2044 bits based on 1637 input information bits, and/or the second BCH coder generates codewords with 2044 bits based on 2022 input information bits, and the third BCH coder generates codewords with 1022 bits based on 1000 input information bits. This configuration is particularly suitable for the desired transmission rate about 1 Gbps. However, the present invention is not limited thereto. The length of the primitive polynomial as well as the particular code is preferably to be selected in accordance with the system requirements.

Advantageously, the mapping is one of a QPSK Gray mapping, BPSK, $Z^2$ or $RZ^2$ mapping, the lattice transformation includes translation, scaling and/or rotation of a symbol, and/or the time-domain modulation is M-PAM. In particular, the first-level mapper may be a QPSK Gray mapper, the second-level mapper may be either the QPSK Gray mapper or a BPSK mapper depending on the BCH code selected, and the third-level mapper is a $Z^2$ or $RZ^2$ (as far as possible Gray) mapper. Gray mapping has the advantage that an error of detecting instead of a constellation point another near constellation point results in a lower number of bit errors, for instance, in a single bit error. It is noted that the present invention is not limited to M-PAM as a modulation. In general, the present invention may also work well with difference modulations, such as a difference M-PAM based on quantization device. Other time domain modulations such as phase shift keying modulations may also be considered, however, these would likely lead to a less efficient system.

Preferably, the method further comprises a step of Tomlinson-Harashima precoding applied to the modulated symbols. However, other equalization approaches are also possible for the present invention. For instance, instead of precoding, a Feed-Forward Equalizer may be applied at the receiver. This may be more suitable for systems, in which a feedback channel from the receiver to the transmitter is difficult to implement. It is noted that these were only examples and the present invention may work also with any other equalization techniques.

In accordance with yet another aspect of the present invention, an apparatus is provided for coding digital data for transmission over a plastic optical fibre. The apparatus comprises a multi-level coset coder for coding input digital data by a three-level coset coding, wherein the multi-level coset coder further includes a demultiplexer for separating from the input digital data a first portion, a second portion and a third portion of data, each with a predetermined number of bits; a first BCH coder coding the first portion of data with a first BCH code in a first level; a second BCH coder in a second level, wherein the second BCH coder is adapted to code the second portion with either a second or a third BCH code provided both in the second BCH coder, wherein the third BCH code has a codeword length lower than the codeword length of the first and the second BCH code, and the third BCH code has substantially same coderate as the second BCH code; a first mapper in the first level for mapping the coded first portion onto symbols of a first predefined constellation and performing a lattice transformation of the mapped symbols so as to achieve coset partitioning; a second mapper in the second level for mapping the coded second portion onto symbols of a second predefined constellation depending on whether second or third BCH code was used and performing a lattice transformation of the mapped symbols so as to achieve coset partitioning; a third mapper in the third level for mapping the third portion onto symbols of a third predefined constellation and performing a lattice transformation of the mapped symbols; and an adder for adding the transformed symbols from the first, the second and the third level. The apparatus further comprises a modulator for modulating the symbols encoded with the three-level coset coding using a time-domain modulation.

In accordance with still another aspect of the present invention, an apparatus is provided for decoding a digital signal encoded with a three-level coset coder and received via a plastic optical fibre, the apparatus comprising: a demodulator for demodulating the encoded digital signal with a time-domain modulation to obtain symbol codewords, a transform unit for transforming the demodulated symbols with an inverse lattice transformation; a multi-stage decoder for decoding the demodulated and transformed symbols, the multi-stage decoder having three stages and further comprising: a first extractor for extracting a first portion of a codeword by applying an inverse lattice transformation and a modulo operation to a demodulated symbol; a first BCH decoder for decoding in a first stage the first portion and based on the decoded first portion selecting a first coset; a second extractor for extracting a second portion by applying an inverse lattice transformation and a modulo operation to a symbol obtained by subtracting the decoded first portion from the demodulated symbol; a second and a third BCH decoder on a second stage applying a respective second BCH code and third BCH code, wherein the third BCH code has a codeword length lower than the codeword length of the first and the second BCH code, and the third BCH code has substantially same coderate as the second BCH code; a decoder for decoding in a second stage the second portion with the second or the third BCH decoder and based on the decoded second portion select a second coset; a third extractor for obtaining a third portion by subtracting the decoded first and second cosets from the demodulated symbol and applying an inverse lattice transformation and a modulo operation; and a multiplexer for multiplexing the decoded first, second and third portion.

In accordance with a preferred embodiment of the present invention, an integrated circuit is provided, implementing any of the above described method.

Advantageously, a system is provided for transmitting digital data over plastic optical fibre. The system comprises a transmitter including a coding apparatus as described above, electro-optic converter for converting the coded signal into optical signal and for injecting the optical signal into the POF, an opto-electric detection element for transforming an optical signal received from the POF to an electric signal, and a decoder as described above for decoding the received signal.

The above and other objects and features of the present invention will become more apparent from the following description and preferred embodiment given in conjunction with the accompanying drawings in which:

FIG. 2A is a graph illustrating a optical bandwidth of a plastic optical fibre as a function of its length;

FIG. 2B is a graph illustrating a product between optical bandwidth and length as a function of length;

FIG. 17 is a table including valid configurations of the MLCC code according to an advantageous embodiment of the present invention;

Figure 28:
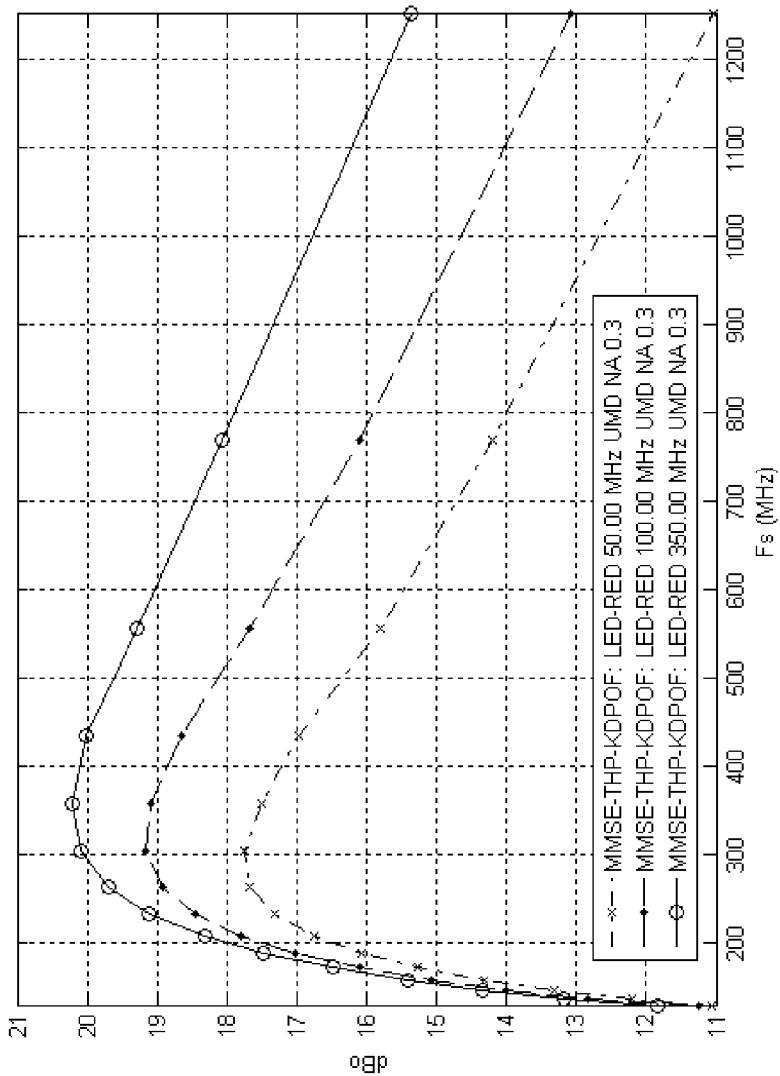
Figure 18:
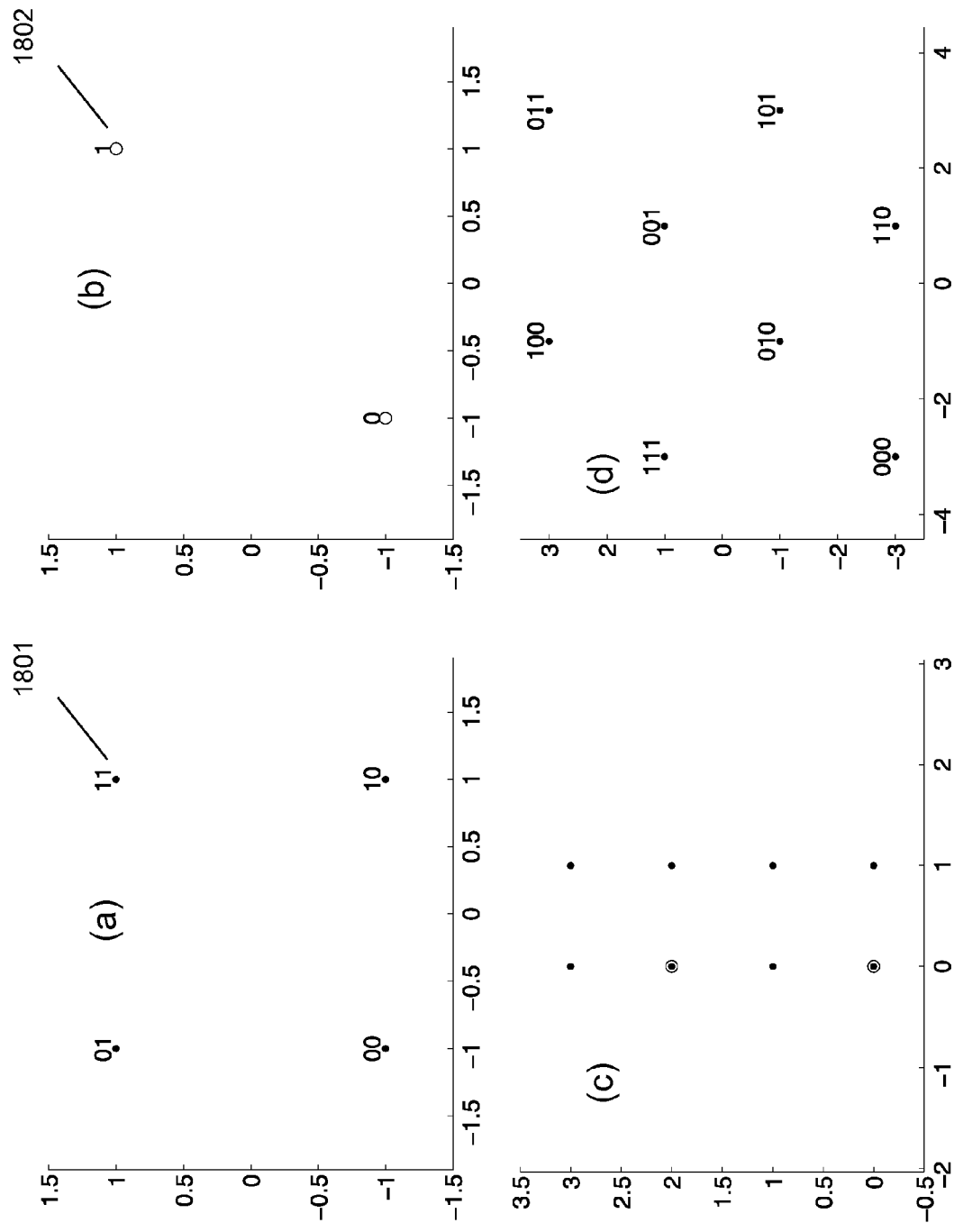
Figure 19:
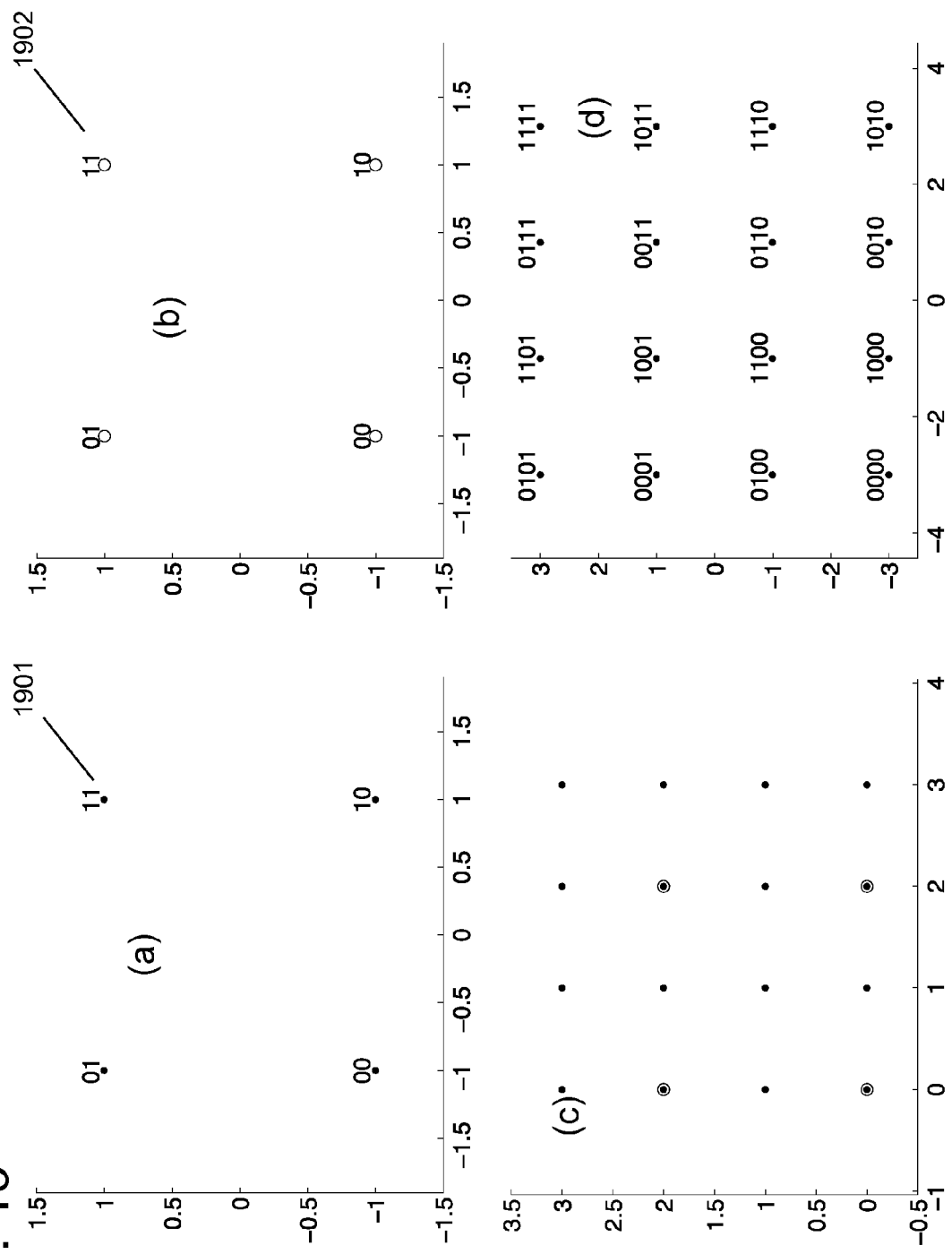
Figure 20:
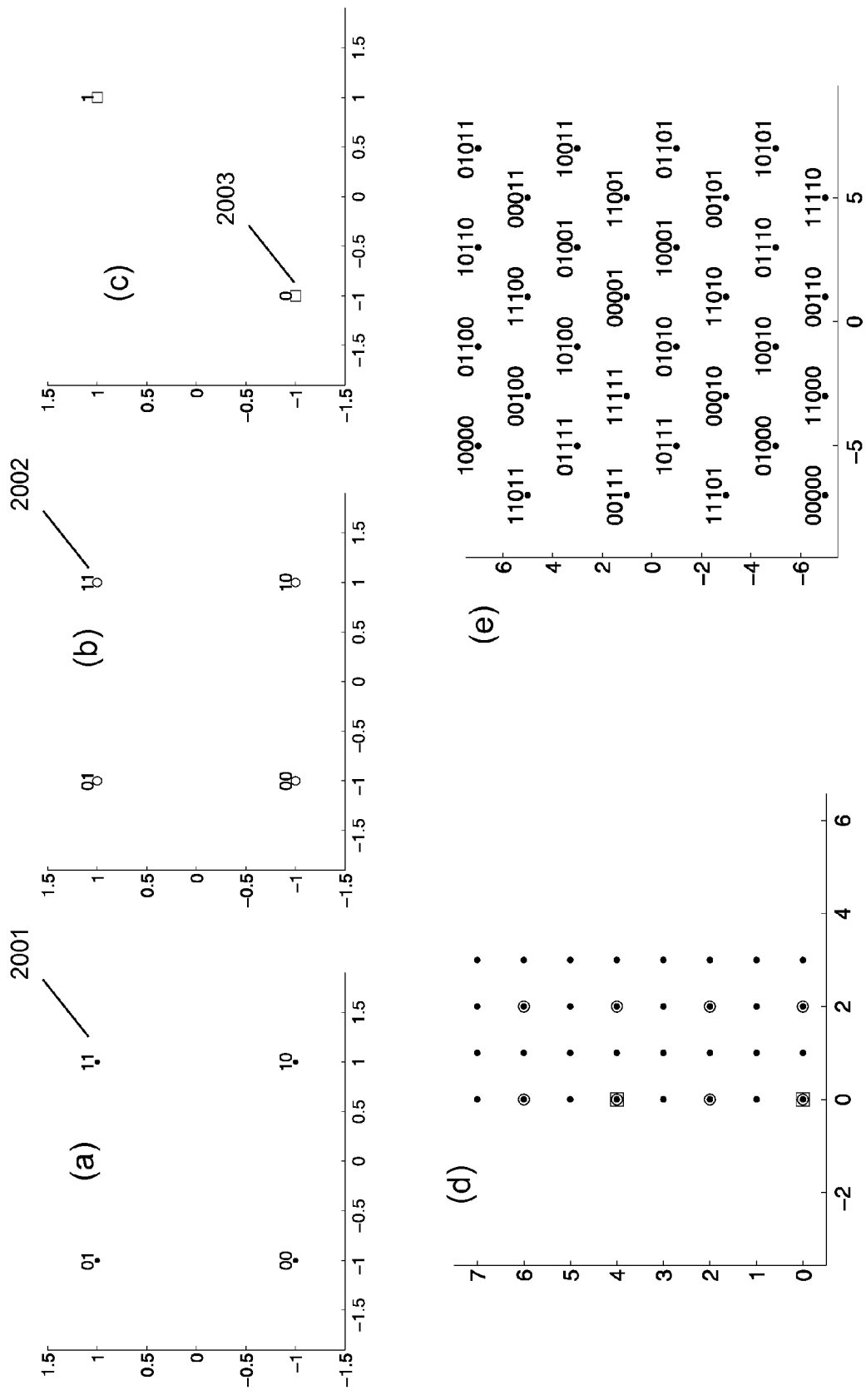
Figure 21:
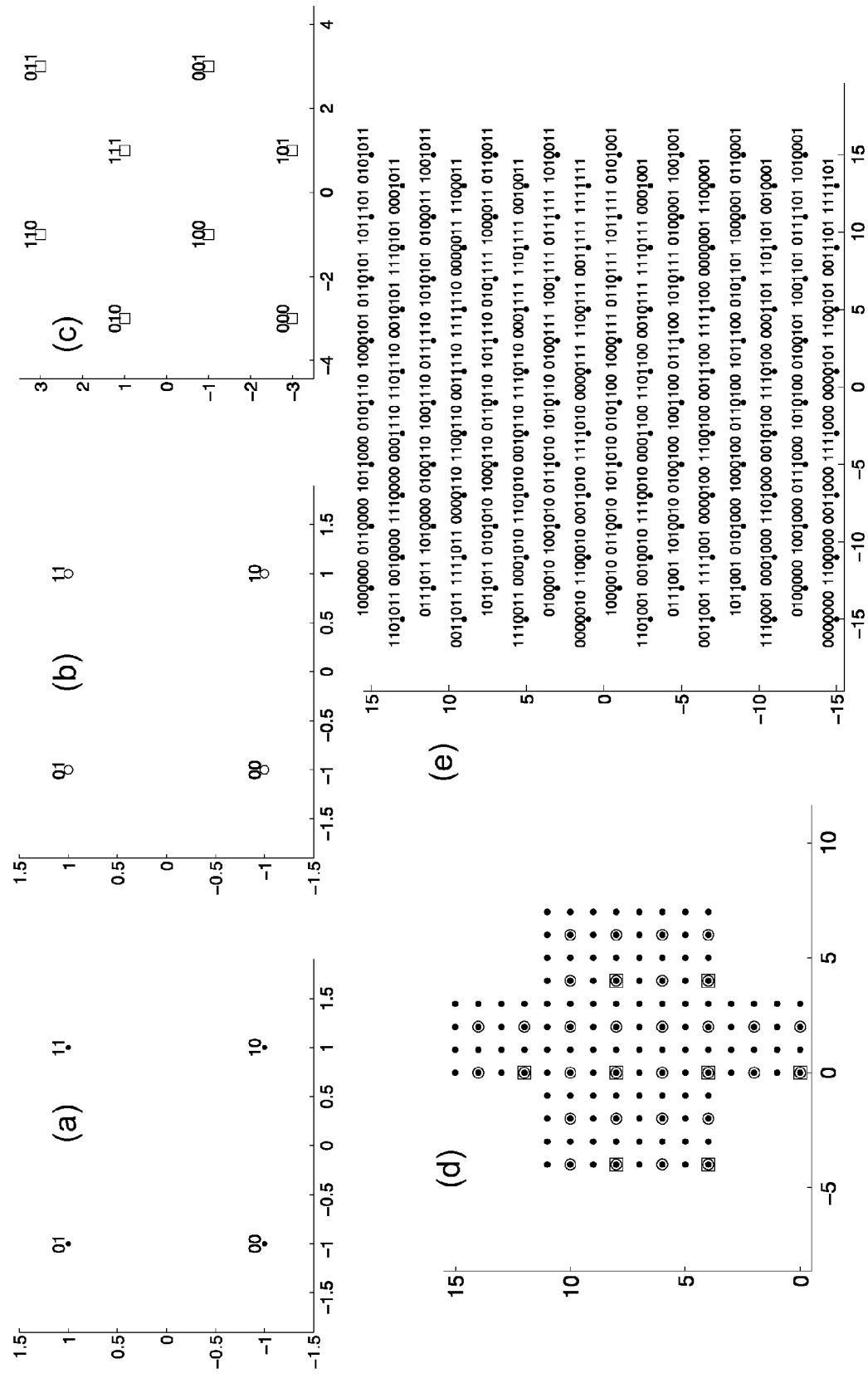
Figure 23:
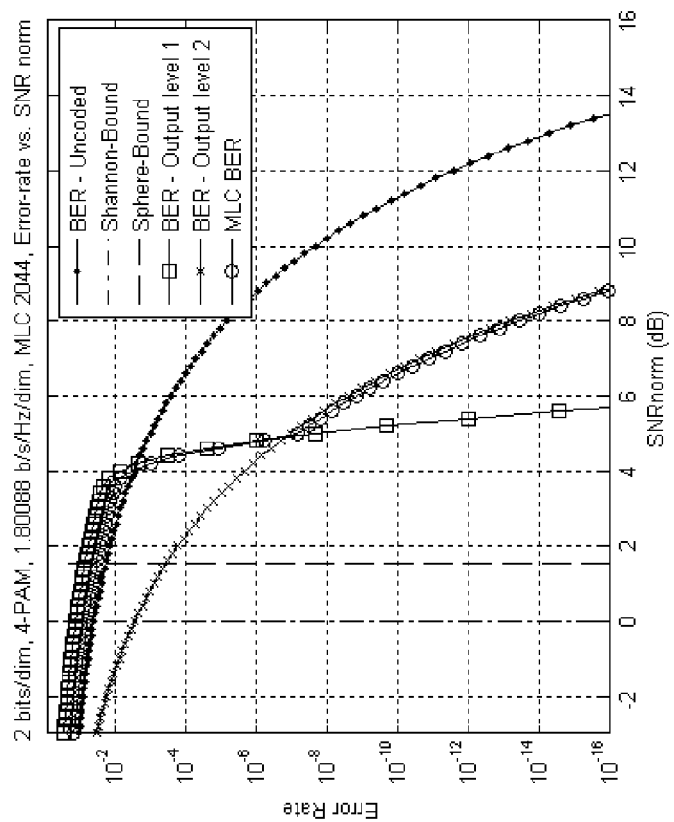
Figure 22:
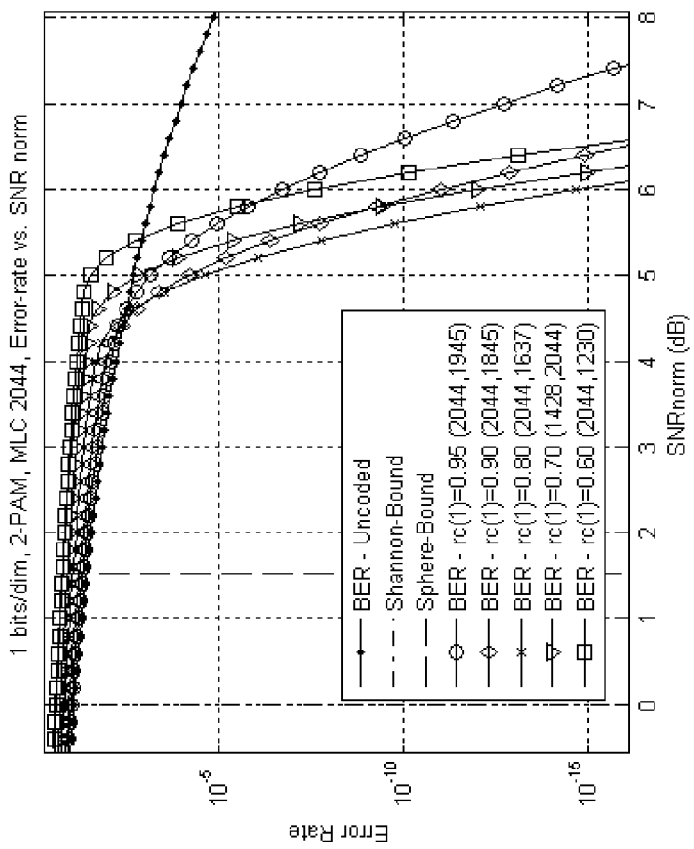
Figure 25:
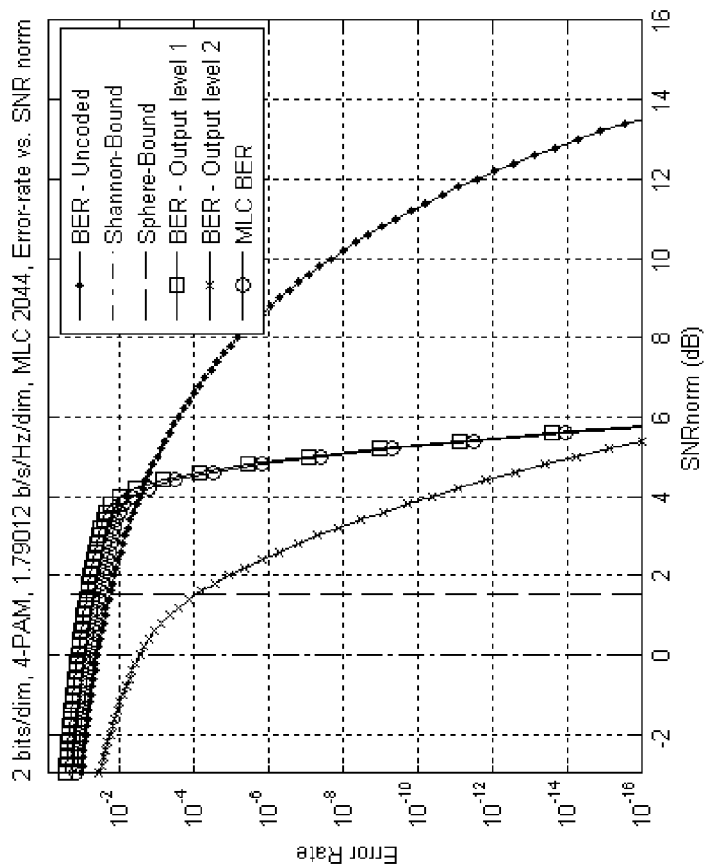
Figure 24:
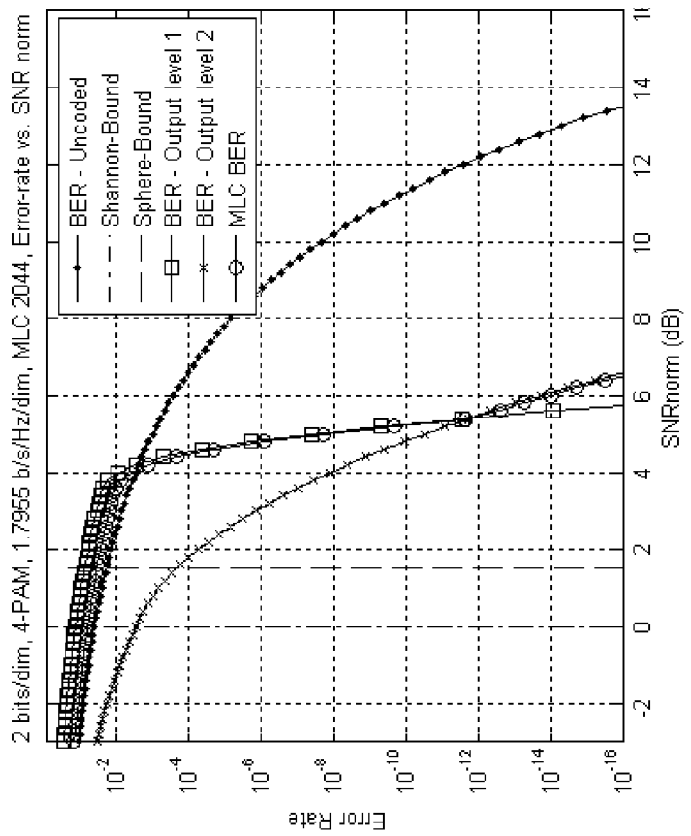
Figure 27:
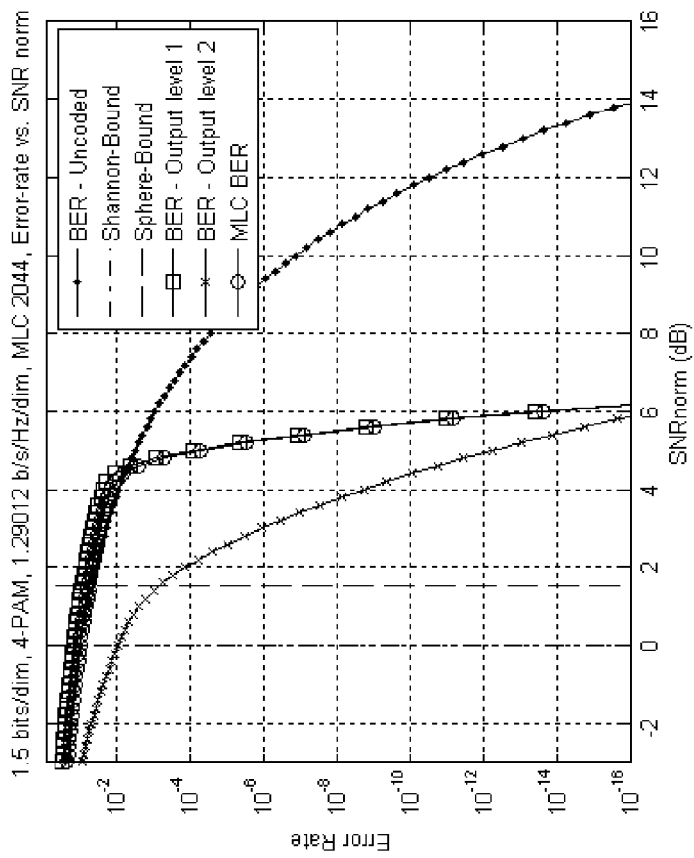
Figure 26:
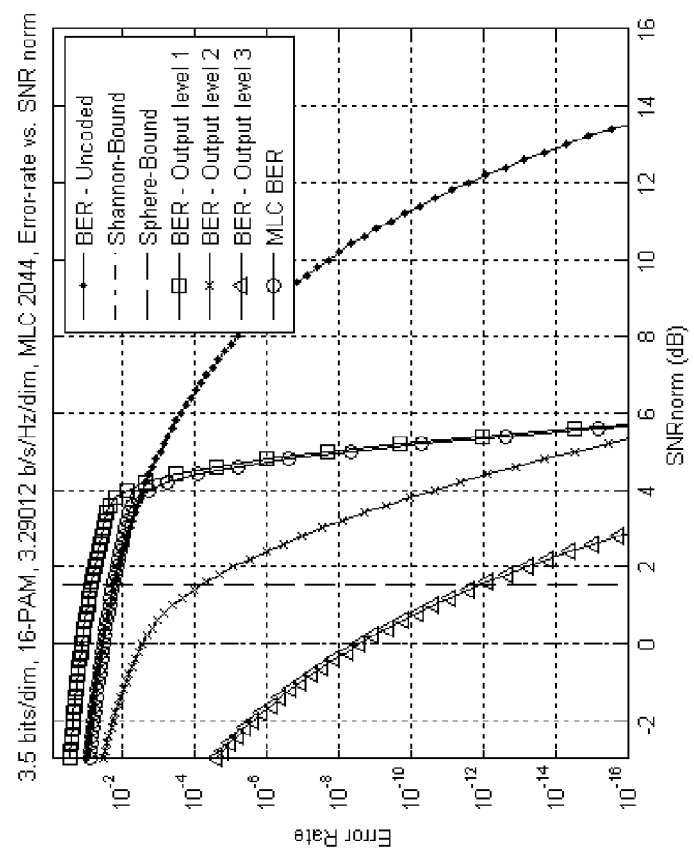
Figure 29:
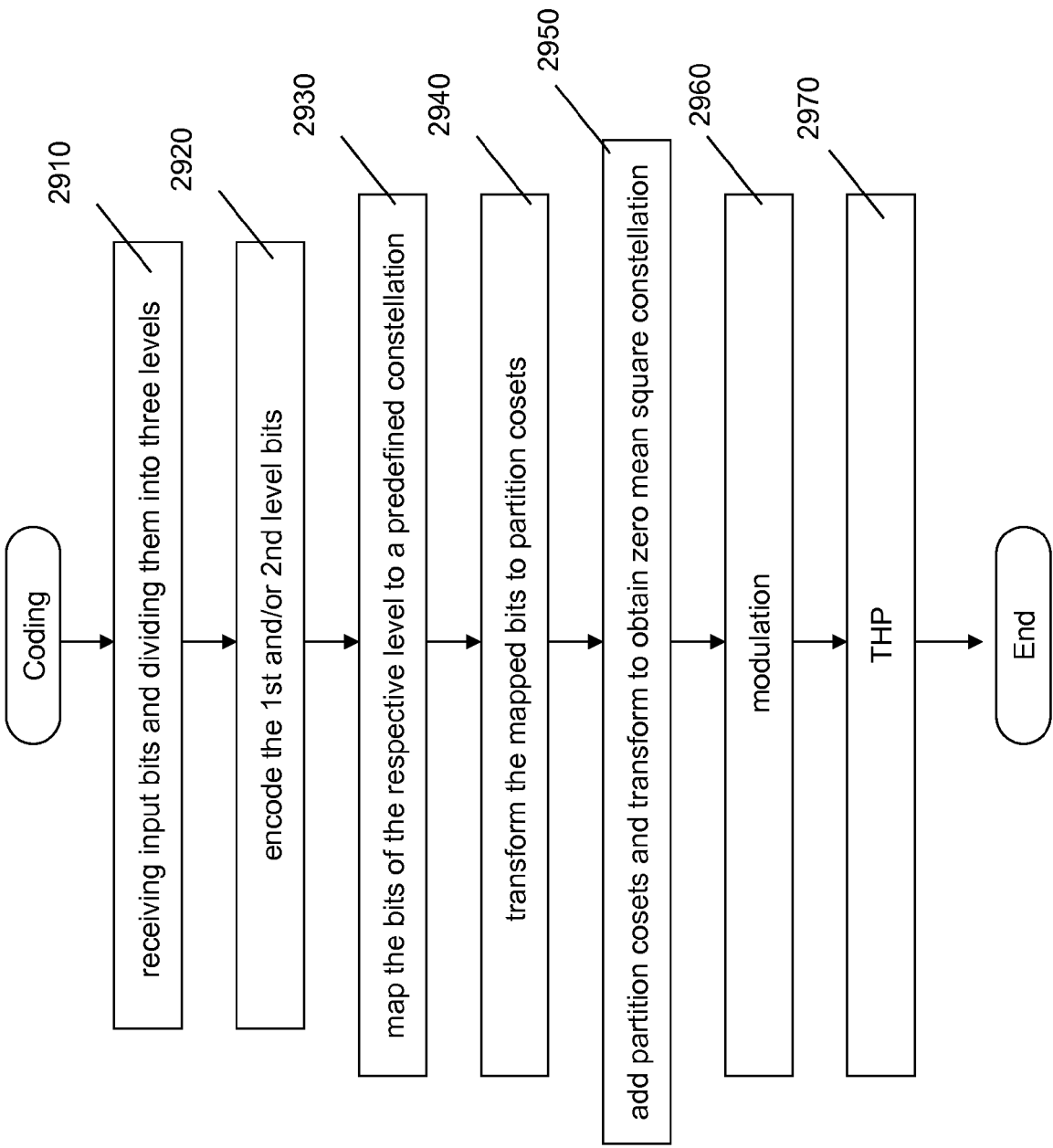
Figure 30:
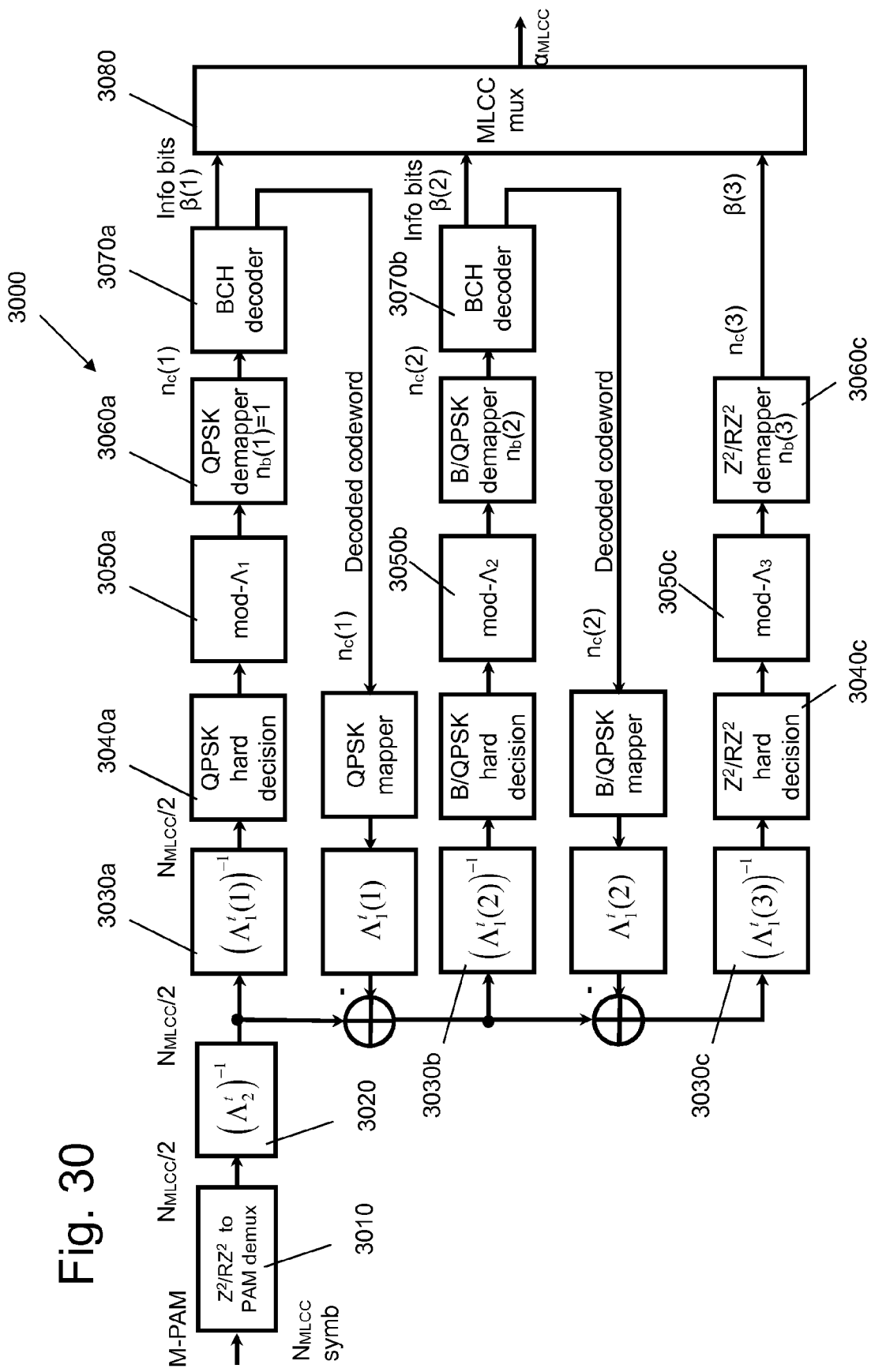
Figure 31A:
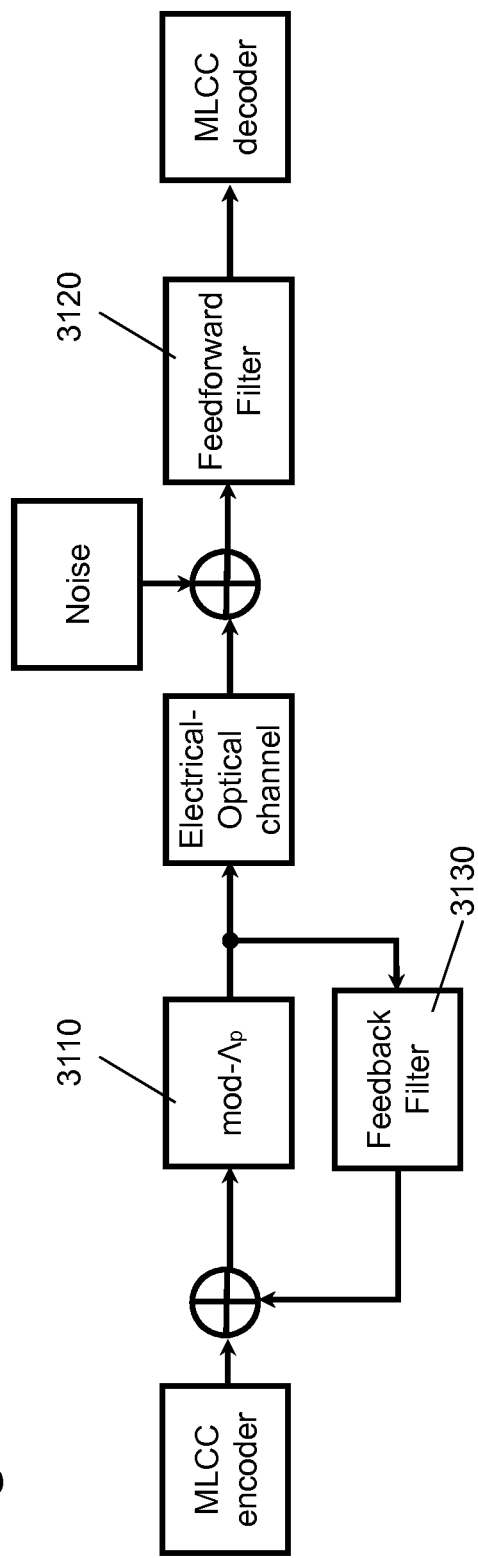
Figure 31B:
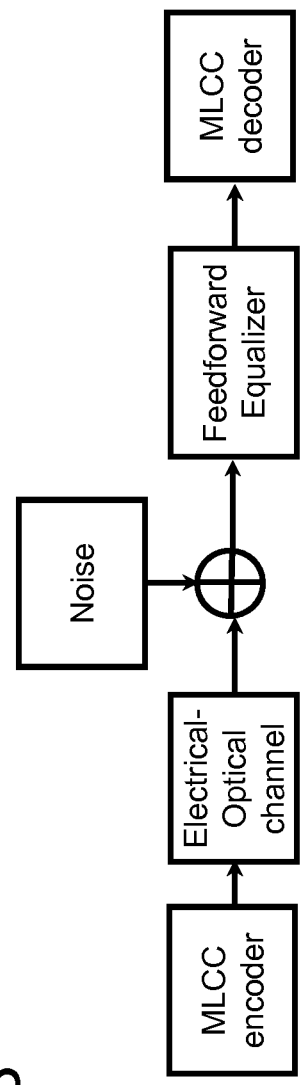
Figure 31C:
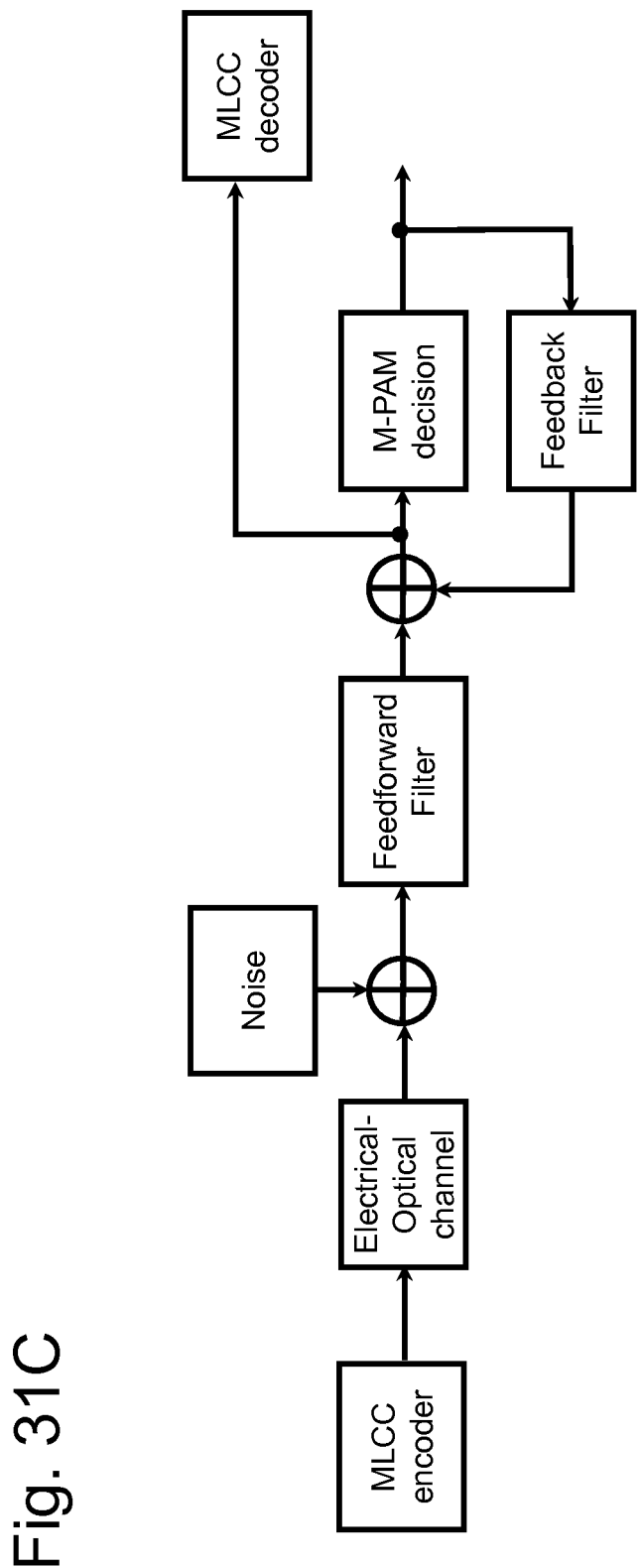
Figure 32:
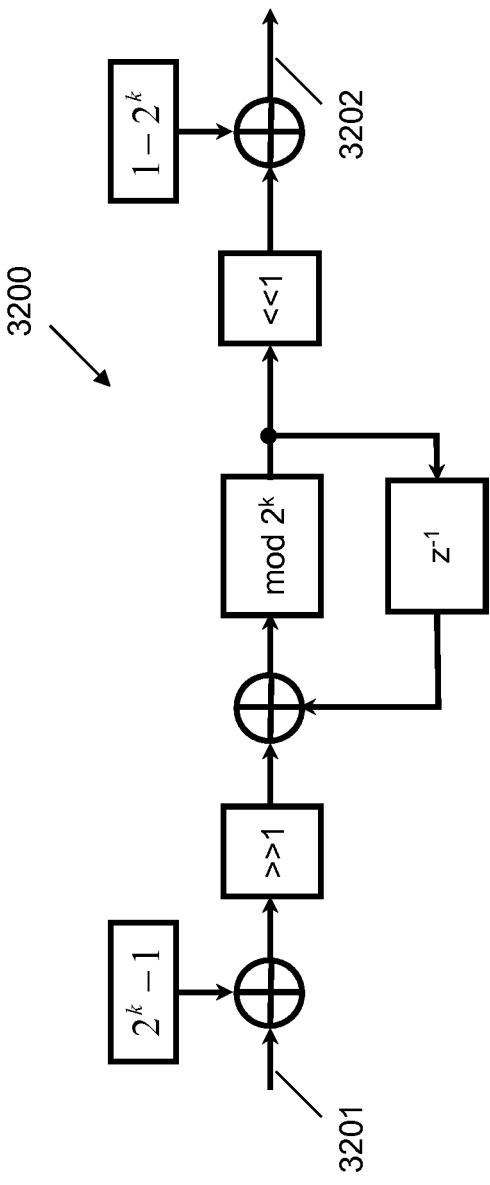
Figure 33:
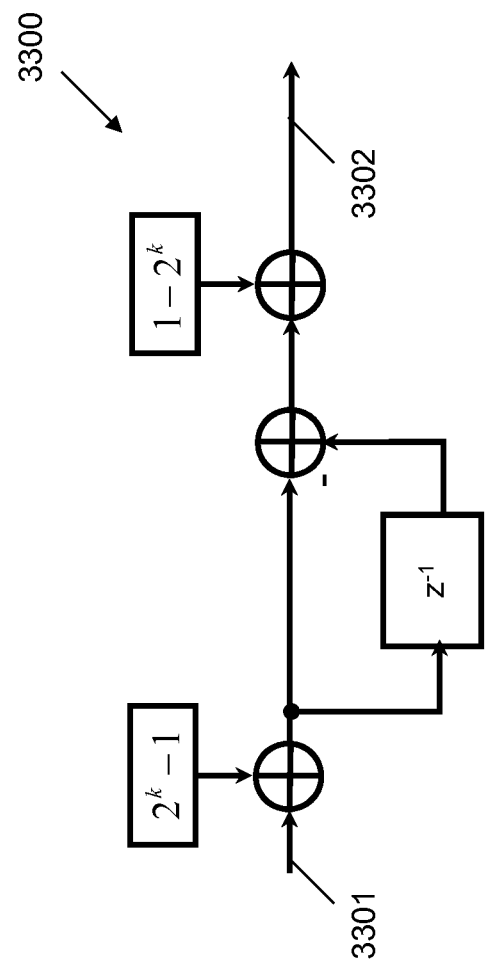
Figure 34:
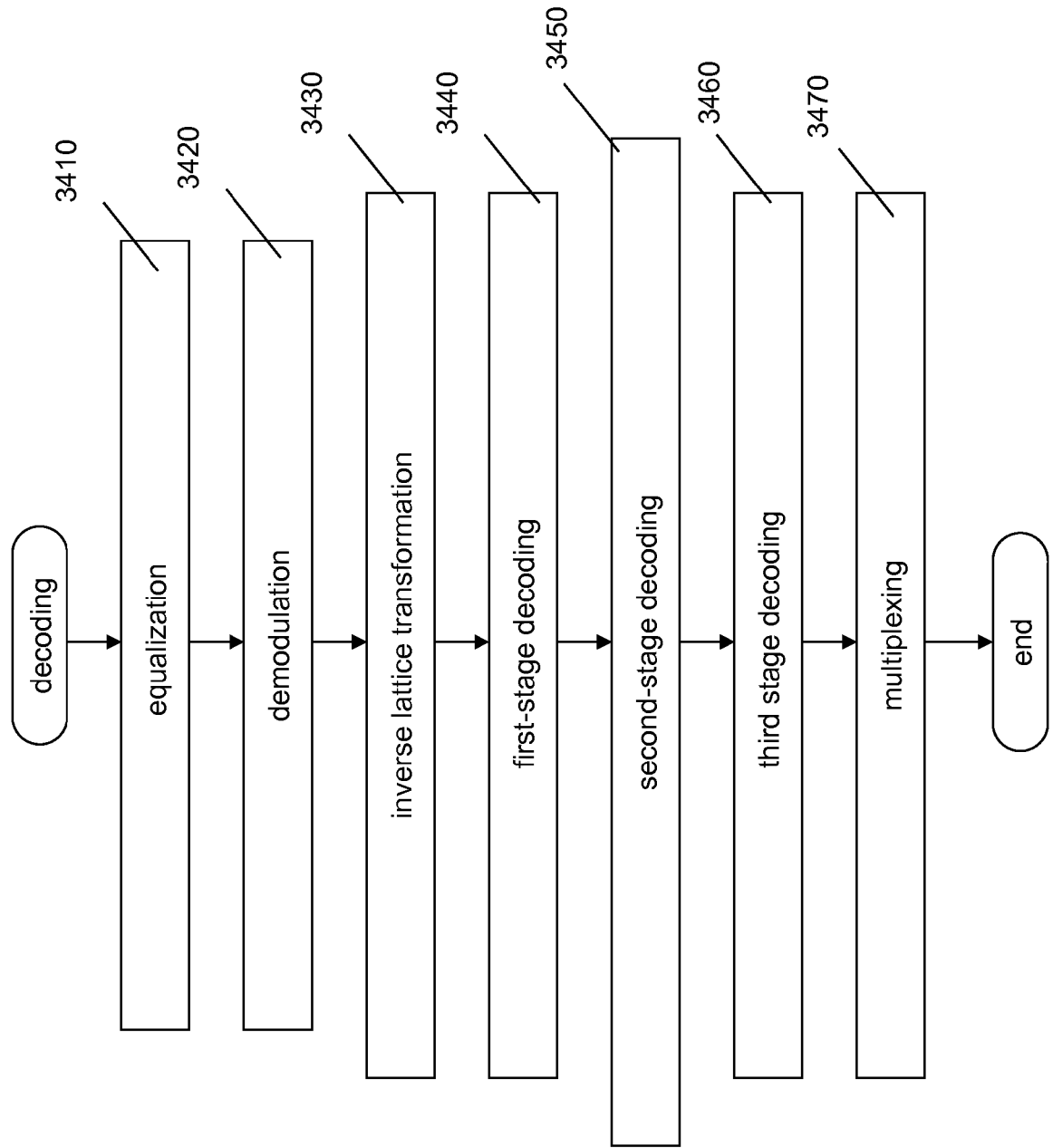

FIG. 18 includes constellation diagrams for the first and second level, for constellations after mapping and lattice transformation, and for the final constellation, assuming second configuration from FIG. 17;

FIG. 19 includes constellation diagrams for the first and second level, for constellations after mapping and lattice transformation, and for the final constellation, assuming third configuration from FIG. 17;

FIG. 20 includes constellation diagrams for the first, second and third level, for constellations after mapping and lattice transformation, and for the final constellation, assuming fourth configuration from FIG. 17;

FIG. 21 includes constellation diagrams for the first, second and third level, for constellations after mapping and lattice transformation, and for the final constellation, assuming sixth configuration from FIG. 17;

FIG. 22 is a graph representing bit error rate curves for different BCH code rates in the first level;

FIG. 23 is a graph representing bit error rate curves for the first level and the second level as well as for the entire scheme without BCH code in the second level;

FIG. 24 is a graph representing bit error rate curves for the first level and the second level as well as for the entire scheme with a BCH code capable of correcting a single bit error in the second level, and where 1 bit per dimension is encoded in the second level;

FIG. 25 is a graph representing bit error rate curves for the first level and the second level as well as for the entire scheme with a BCH code capable of correcting two bit errors in the second level, and where 1 bit per dimension is encoded in the second level;

FIG. 26 is a graph representing bit error rate curves for the first level and the second level as well as for the entire scheme with a BCH code capable of correcting two bit errors in the second level, and where 0.5 bits per dimension is encoded in the second level;

FIG. 27 is a graph representing bit error rate curves for the first level, the second level, and the third level as well as for the entire scheme;

FIG. 28 is a graph illustrating link power budget for predefined conditions and three different bands;

FIG. 29 is a flow diagram illustrating a coding method in accordance with an embodiment of the present invention;

FIG. 30 is a block diagram showing a decoder with a three level coset decoding and demodulation in accordance with an embodiment of the present invention;

FIG. 31A is a block diagram illustrating Tomlinson-Harashima precoding adapted according to an embodiment of the present invention;

FIG. 31B is a block diagram showing Feed-Forward Equalizer, which may be used with the present invention;

FIG. 31C is a block diagram showing Decision Feedback Equalizer, which may also be used with the present invention;

FIG. 32 is a block diagram illustrating a differential modulator according to an embodiment of the present invention;

FIG. 33 is a block diagram illustrating a differential demodulator according to an embodiment of the present invention; and FIG. 34 is a flow diagram illustrating a decoding method in accordance with an embodiment of the present invention.

DETAILED DESCRIPTION

The problem underlying the present invention is based on an observation that techniques typically used for optical glass fibre are not sufficient to achieve an efficient transmission of data over a plastic optical fibre. Due to a difference between characteristics of plastic optical fibre channels compared to glass optical fibres, wireless or copper channels, the techniques developed and employed for such channels are also not directly applicable to plastic optical fibres. It is one of the aims of the present invention to enable a highly spectrally-efficient data communications over POF.

One of the general criteria for designing a communications system is maximizing the capacity of the channel. Channel capacity bound can be calculated in accordance with the information theory using the Shannon limit on rate defined as maximum mutual information of a random variable at the input and the output of the channel. However, in practice it is difficult to achieve such theoretical bounds. This is caused inter alia by the real elements employed, which in general do not have ideal characteristics. Another important factor when designing a communications system is its efficiency in terms of implementation complexity, which has direct impact on the costs and feasibility of the product as well as on its latency.

When designing a communication system employing plastic optical fibres it is therefore necessary to consider limitations of both electrical and optical elements necessary for signal processing. Considering all the elements affecting the transmitted signal such as current driver, light-emitting elements, POF itself, photodiodes, trans-impedance amplifiers, etc., the communication channel is to be considered as non-linear. The main source of non-linearity is the characteristics of the conversion of electrical intensity into optical power of the LED. On the other hand, plastic optical fibres are power peak limited communication channels. This feature makes POF different from other types of channels used for communications such as copper or wireless channels in which the transmission signal is constrained to fulfil a given power spectral density and/or average power. The peak limit is caused by the fact that the optical signal cannot be negative and that the electrical intensity is limited in light emitters such as LED or laser diode in order to extend the life of the device.

Typically, the communications systems are designed by looking for a trade-off between the bandwidth and the signal-to-noise ratio (SNR). The aim of the optimization is to achieve the capacity bounds known from theory. Key digital techniques having impact on approaching of the capacity limit are modulation, compensation of the inter-symbol interference and coding. These techniques have to be designed with regard to the characteristics of the communication channel and possibly with regard to each other.

Crest factor (also called peak-to-average ratio) is a ratio of a peak amplitude of the waveform divided by root mean square of the waveform. For optical systems, a modulation is appropriate which minimizes the crest factor and maximizes the variance of the optical signal for a given optical modulation amplitude (OMA) injected to the POF. Modulation techniques that enable this are the M-ary pulse amplitude modulation (M-PAM) and the difference M-PAM. Assuming a zero-mean constellation before electro-optic conversion, the crest factor is minimized and the average energy of the symbol is minimum for a given constellation minimum distance, since several levels of the signal are uniformly distributed. The number of levels of the pulse amplitude modulation may be defined as a function of the bandwidth, required bit rate, and/or coding. In order to design modulation appropriately, a link power budget of the plastic optical fibre channel has to be analyzed. For maximizing the link power budget, there exists an optimum value for the number of levels and the signal bandwidth for a desired transmission rate as will be shown later. A high spectral efficiency communications system is necessary in order to maximize the link power budget. Based on this requirement, equalization and channel coding have to be designed with regard to the modulation.

As a consequence of signal broadening in the transmission medium, here POF, the neighbouring data carrying symbols overlap when received, which makes it difficult to detect and decode them correctly. This effect is called inter-symbol interference. In order to recover such symbols, equalization techniques are typically employed. There are many equalization approaches at the receiver side available in the prior art including MMSE equalizer, zero-forcing, feed-forward equalizer, decision-feedback equalizer, etc.

In order to efficiently design a communication system, based on Volterra models which may be obtained for particular channel by means of analysing its measured characteristics, the linear and non-linear parts of the channel characteristics may be separated. For the linear part of the channel, link power budget maximization in accordance with information theory may be performed. Moreover, the equalization may be designed independently for the linear and the non-linear part of the channel. At the transmitter and/or the receiver side, a linearizer (a non-linear filter structure) may be employed to provide a far enough linear channel where the well known equalization techniques may be used.

For instance, a Feed-Forward Equalization (FFE) is an equalization technique employed at the receiver that corrects the received waveform based on information about the waveform itself, in particular about the current waveform and waveform associated with the previously received communication symbols. The equalization is performed on the waveform (voltage levels) before any decisions on the received bits are met. Another well-known technique is Decision Feedback Equalization (DFE). DFE calculates a correction value that adapts decision thresholds for detecting multi-dimensional modulation symbols. Thus, DFE results in shifting the threshold based on which new decisions are made (more details on DFE and equalization can be found in J. G. Proakis, *Digital Communications*, 4$^{th}$ Edition, McGraw-Hill Book Co., New York, 2001, incorporated herein by reference). A drawback of the DFE is error propagation, resulting from decision errors at the output of the decision device which cause incorrect estimation of the postcursor Inter-Symbol Interference (ISI). The error propagation can be avoided by using transmitter precoding.

Precoding enables moving the cancellation of the post-cursor ISI to the transmitter where the data symbols are available. Moreover, a feed-back filter is employed to precode the signal using a current channel impulse response. The impulse response is typically estimated at the receiver using adaptive filter techniques and fed back to the transmitter. There are several different variations of precoders (cf., for instance, G. D. Formey and G. Ungerboeck "*Modulation and coding for linear Gaussian channels*", IEEE Trans. on Information Theory, vol. 44, no. 6, October 1998, pp. 2384-2415, which is incorporated herein by reference). One of the precoding techniques, namely Tomlinson-Harashima precoder (THP), is of particular interest. The Tomlinson-Harashima precoding (for more details see, for instance, R. D. Wessel, J. M. Cioffi, "*Achievable rates for Tomlinson-Harashima Precoding*", IEEE Trans. on Inf. Theory, vol. 44, no. 2, March 1998, pp. 824-831, which is also incorporated herein by reference) is considered as a prominent precoding scheme especially due to its capability to efficiently cancel out the known interference at the transmitter side. Therefore, the information rates achieved by THP are superior to those achieved by conventional linear precoding schemes.

Figure 3:
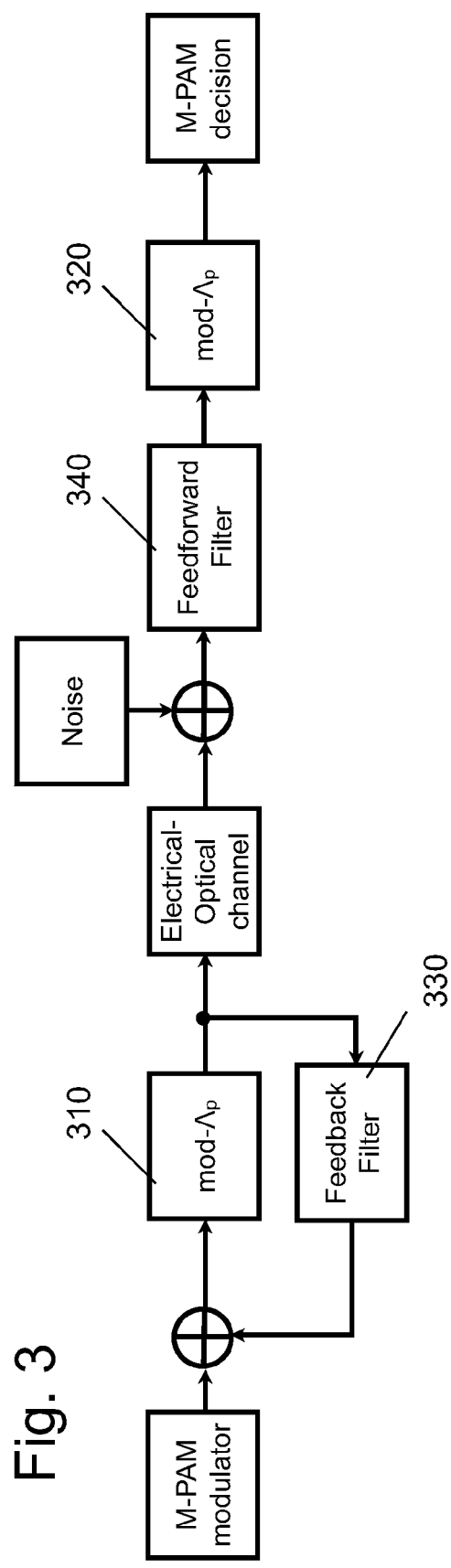
FIG. 3 is a block diagram illustrating the functionality of Tomlinson-Harashima Precoding.

FIG. 3 illustrates a known employment of THP with an M-PAM modulation. The Tomlinson-Harashima precoder moves the feedback filter 330 of a DFE structure to the transmitter and combines it with a modulo operator 310 in order to reduce the post-cursor ISI compensated symbols to the precoding Voronoi region of the corresponding M-PAM constellation. The feed-forward filter 340 remains at the receiver to compensate the cursor and pre-cursor ISI and to whiten the noise. Then, a modulo operator 320 analogous to the transmitter-side modulo operator 310 is needed to recover the transmitted symbols. The THP is capable of approaching the performance of the ideal DFE without error propagation, for middle and high spectrally efficient modulations.

However, THP equalization presents four inherent capacity losses precoding loss, crest-factor loss, modulo loss, and shaping loss, from which only the first two are relevant for the aimed application to POF. These losses are mainly caused by the application of the modulo operator and depend on the number of modulation levels as shown below.

The modulo operator together with the feedback filter at the transmitter converts a discrete uniform distribution of M-PAM symbols into a continuous uniform distribution extending to the full Voronoi region of the original constellation (assuming that the energy dispersion of the feedback filter is large enough to completely fill the Voronoi region corresponding to precoding). This results in an increase of transmission signal energy, which needs to be compensated by the transmitter in order to input the same average power to the POF. Therefore, the energy increase leads at the receiver to a loss of the available SNR, which is called precoding loss. The precoding loss can be estimated as a function of number of modulation levels M as:

$$\xi(dB) = 20 \cdot \log_{10}\left(\sqrt{\frac{M^2}{M^2-1}}\right).$$

For instance, for PAM with 2 levels (2-PAM), the precoding loss is approximately 1.25 dB. For larger constellations, the precoding loss decreases towards zero.

The translation from the M-PAM discrete constellation to the continuous Voronoi region performed by THP also results in an increase of the crest factor. The crest factor of a M-PAM modulation depends on M and varies between 0 dB for the 2PAM and the asymptotical 4.77 dB for arbitrary high number of modulation levels. A THP precoded signal has a constant crest factor of 4.77 dB, assuming that the whole Voronoi region is filled. The loss of crest factor is a difference between the crest factor on the input and the output and is defined as:

$$\gamma(dB) = 20 \cdot \log_{10}\left(\sqrt{3 \cdot \frac{M-1}{M+1}}\right).$$

As POF is a power-peak limited channel, the crest factor loss indeed represents decreased performance.

Figure 4:
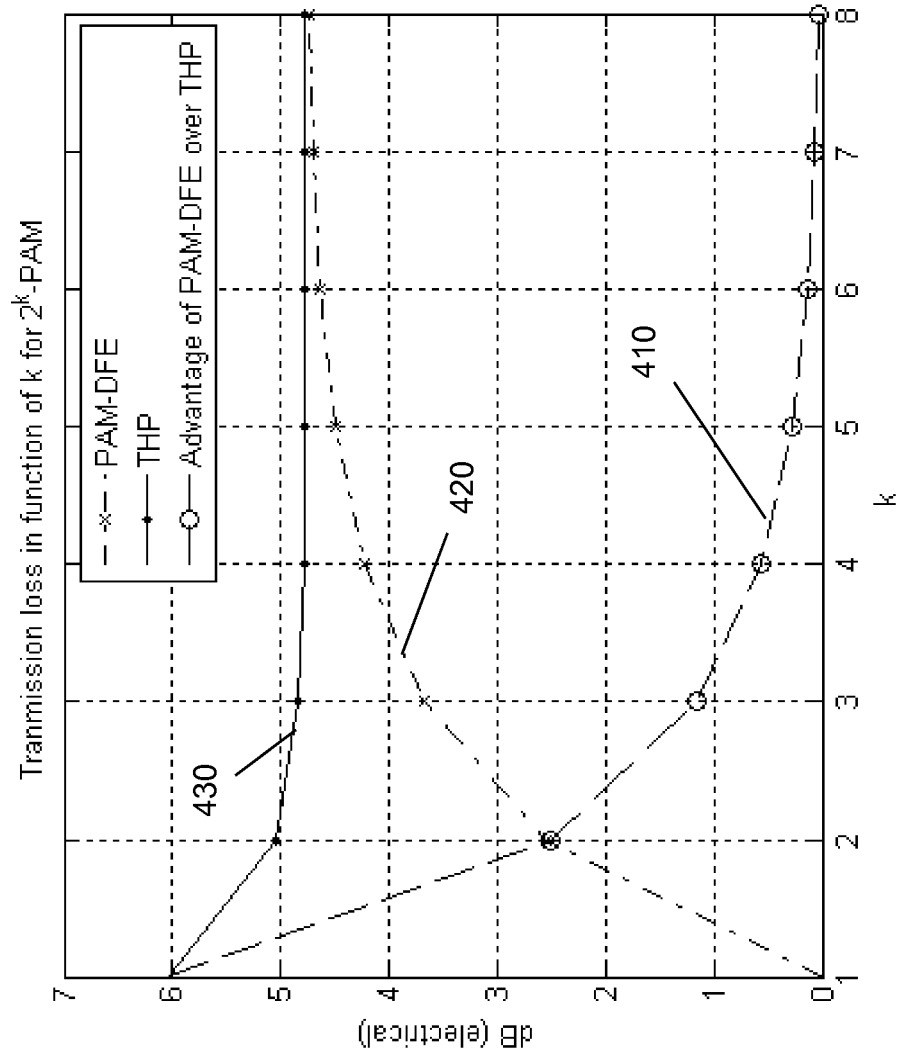
FIG. 4 is a graph illustrating the transmission performance of Tomlinson-Harashima Precoding.

FIG. 4 shows performance loss (in dB) of a transmission with THP considering both the precoding loss and the crest factor loss as a function of the number of modulation levels $M=2^k$. Curve 420 represents the loss due to crest factor of the M-PAM modulation which would be completely equalized by the receiver (decision feedback equalizer or feedforward equalizer). For 2-PAM (k=1) there is no loss, since the crest factor of 2-PAM is 0 dB. Curve 430 shows the transmission loss for THP (the precoding loss plus crest factor loss) which becomes asymptotically the same as the crest factor loss for the high numbers of modulation levels. Finally, curve 410 illustrates the advantage of M-PAM with respect to THP as a function of M. Since the crest factor for THP is constant and equal for all values of M, namely 4.77 dB, it can be seen as an extra loss due to precoding in the rather small range of M up to 4. The loss of performance is negligible for M equal to or higher than 4 (corresponding to k≥2). When M is sufficiently high, the precoded symbols are independent and uniformly distributed random variables. This implies that the statistics of the precoded symbols are very similar to the statistics of the original data symbols and the spectrum of the precoded symbols is white. Moreover, since precoding is employed at the transmitter side, there is no problem with applying a more complicated modulation coding such as trellis-coded modulation or coset coding, which require postponing of decisions and cannot be therefore well combined with a DFE at the receiver.

However, THP employed at the transmitter requires a feedback from the receiver in order to obtain current channel response. Despite of this small implementation drawback, THP still remains suitable for the prevailing part of the aimed POF applications. For instance, THP is suitable for any of a star topology, daisy chain topology or tree topology. In the star topology, each node is connected to the network through a packet switch by means of a duplex POF having two fibres for the respective two directions. In daisy chain topology, some nodes have packet switching capability and more than one duplex interface. A node is connected to the network and, at the same time, works as a bridge between the different network domains with which it is interconnected. Tree topology is an evolution of the daisy chain topology, in which some nodes have more than two duplex POF interfaces. These three topologies are in general suitable for any kind of video-based sensor applications or media distribution, especially for the home network applications, industrial plants or automotive applications, in particular, interconnecting cameras and screens.

However, current automotive applications based on POF also utilize a topology of a physical ring over a simplex POF. Accordingly, several nodes are connected serially or they are connected to a central unit. Such topology is not necessarily optimum for one-sensor applications. Moreover, the implementation of a feedback channel for each pair of nodes along a common ring is difficult to implement, especially for a higher number of nodes involved. For such topologies therefore equalization techniques other than THP may be more convenient. For instance, a feed-forward equalization (FFE), which does not require feedback from the receiver to the transmitter. When physical ring topology is required, FFE may perform better than DFE due a high-spectral-efficiency M-PAM, despite the performance loss due to the noise increase. Namely, DFE may suffer from a considerable error propagation in such a system.

In order to achieve an efficient employment of modulation, coding and precoding, it is important, that these techniques are designed with regard to each other. In particular, when employing a multi-level coset coding, further losses can be avoided by designing the modulo operators so as to separate each coding level in the multi-stage decoder structure and to be congruent with the Voronoi region of the THP. The multistage decoder structure at the receiver thus carries out both separation of partition channels (coding levels) and THP reduction in a single step so that the multi-level coset code decoder based on MSD can directly be connected to the feed-forward filter output as will be described later with reference to FIG. 31A.

In view of the above discussed POF characteristics, the high spectral efficiency aimed by the present invention is only achievable when advanced coding and modulation schemes are employed, such as trellis coded modulation, binary interleaved coded modulation, coset coding, or other coding-modulation schemes. For instance, Binary Interleaved Coded Modulation has a disadvantage of an extensive latency caused by the interleaver. Moreover, it has a lower performance when employed for middle and high spectral efficiency modulations, and a non-uniform coding gain for adaptive bit rate.

A multi-level coset coding is a sphere-bound capacity achieving coding technique. The theoretical description and design of MLCC can be found in G. D. Formey et al., "*Sphere-bound-achieving coset codes and multilevel coset codes*", *IEEE Trans. on Information Theory*, vol. 46, no. 3, May 2000, pp. 820-850, in particular, in Sections V.E, V.F and VII.B as well as in U. Wachsmann et al. "*Multilevel Codes: Theoretical Concepts and Practical Design Rules*", *IEEE Trans. on Information Theory*, vol. 45, no. 5, July 1999, pp. 1361-1391, which are both incorporated herein by reference. The theoretical rules are formulated in terms of the code-rate of the component codes, partition channel capacities and modulo-aliased noise present at each decoding level assuming Multi-Stage Decoder (MSD) decoding. However, the mathematical theory does not deal with the particular characteristics of the binary component codes which are also suitable for implementation in a "real-world", meaning, for instance hardware or software implementation. In the above mentioned literature, Low Density Parity Check Codes (LDPC) have been studies as possible component codes for MLCC. A combination of LDPC in the first level and the BCH in the second level has been suggested supporting a spectral efficiency adaptability of up to 0.25 bits/s/Hz/dim.

However, LDPC codes require a rather high computational complexity for decoding which, on the other hand, requires more area in the hardware implementation and causes higher power consumption. In terms of optical link power budget, the improvement caused by employing LDPC beside BCH appears to be negligible. Moreover, with LCPC code there is a potential error floor a compensation of which could require employment of an additional algebraic outer code.

Bose, Chaudhuri, Hocquenghem (BCH) binary codes are almost perfect algebraic codes in terms of minimum Hamming distance between the codewords. BCH codes do not have an error floor when hard-decision coding is applied. BCH codes also provide advantage of a simple implementation which can easily be embedded, for instance, in an integrated circuit. For high code rates, BCH codes provide high coding gain, which, on the other hand, decreases for middle and lower code rates. Thus, BCH codes are not particularly suitable for adaptivity in terms of their configurable code rate.

Despite, in accordance with the present invention, BCH codes are indeed employed in a system with spectral efficiency adaptation. However, the code rate of BCH codes employed is fixed and the adaptation is performed by means of lattices. In particular, the code rate of the BCH codes selectable in one level is substantially the same in order to avoid coding gain degradation when adapting the spectral efficiency. It is beneficial to have BCH codes selectable with the same code rate. However, the code rate of these BCH codes may also vary as long as the code rate of the second and third BCH codes are selected according to the first BCH code rate, in order to avoid performance loss of the entire MLCC scheme.

The two dimensional lattices used in one of the embodiments of the present invention enable adaptation with step of 0.5 bits/s/Hz/dim. However, a finer step may be achieved, for instance, by means of the coset partitioning implemented over 4-dimensional lattices. The step of 0.5 bits/s/Hz/dim enables the bit rate adaptation in variations of 3 dB of the channel SNR. This SNR variation only represents a variation of 1.5 dB of the optical power entering the optical-to-electric converter (photodiode) included in the optical communication system since a variation of N dB of the received optical power produces a variation of 2 times N dB of the electric current amplitude from the photodiode, resulting in variation of 2 times N dB at the SNR. The most relevant noise comes from the trans-impedance amplifier used to convert the electric current into voltage signal. A finer step of 0.25 bits/s/Hz/dim would enable the adaptation in 0.75 dB steps of the received optical power, which only represents a variation of 19% compared to 41% of the 1.5 dB. Thus, the step of 1.5 dB is sufficient for the present application. The implementation of the 4-dimensional lattices is more expensive and the benefit provided is to be judged with regard to the particular application aimed.

In order to keep latency and the implementation complexity low, MLCC with BCH component codes and lattice-based adaptability is advantageous since it does not need any interleaver and binary BCH coding and decoding may be implemented efficiently. In order to reduce the number of operations per cycle, the MLCC scheme is further designed such that each binary component code involved in the multi-level structure works at the symbol rate and the output encoded bits are mapped onto the MLCC constellation with up to 1 bit per dimension. In particular, the MLCC code includes three levels working with two-dimensional lattices and Ungerboeck partitioning. The three levels can be independently and successively decoded at the receiver by a multi-stage decoder.

Figure 1:
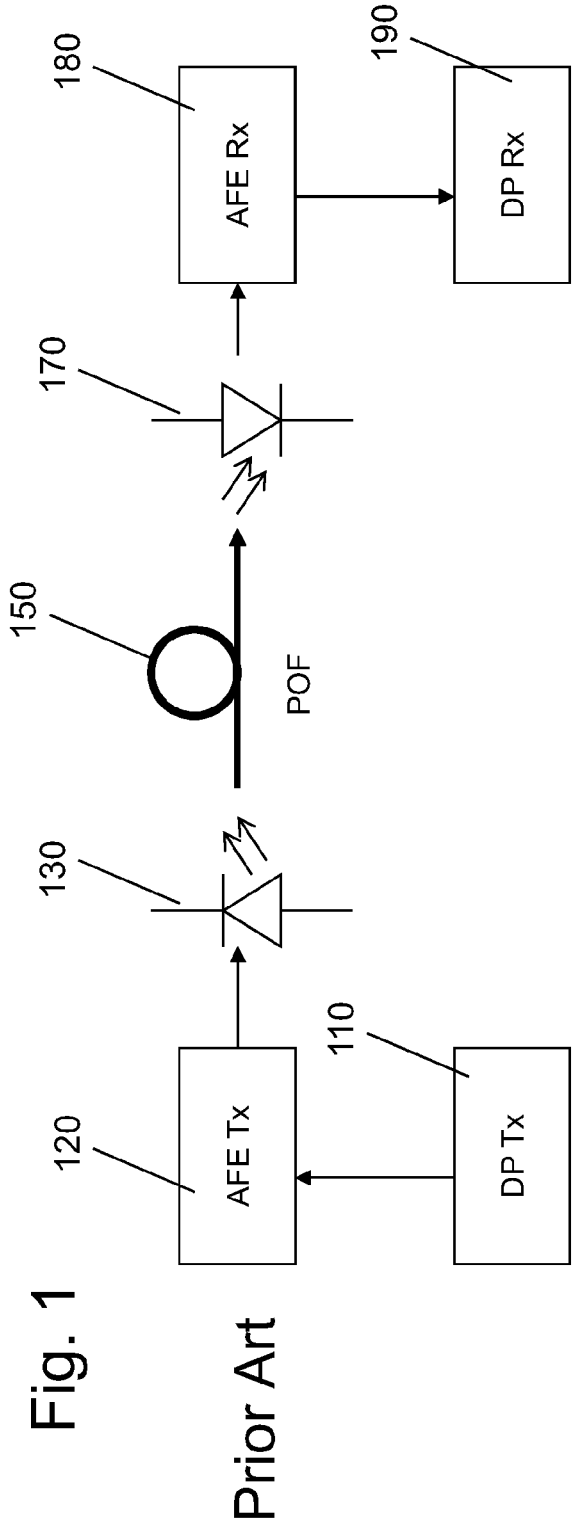
FIG. 1 is a schematic drawing illustrating an example of a system for transmission and reception of data over POF.
Figure 5A:
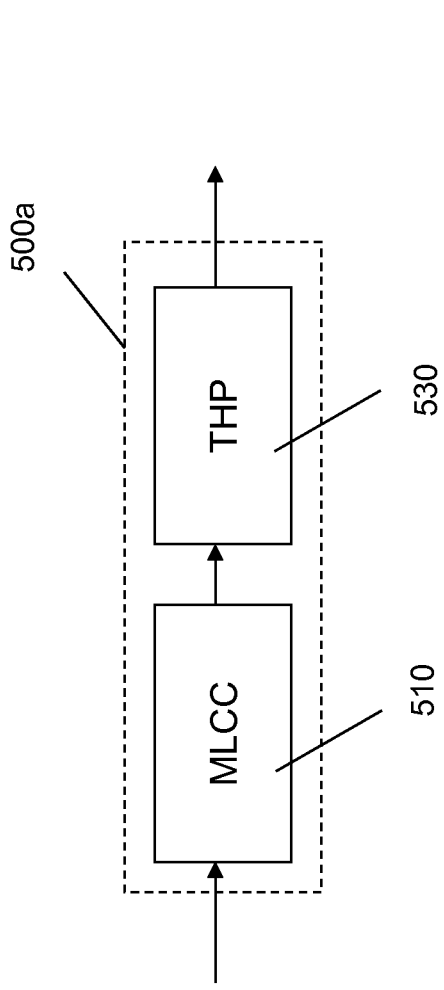
FIG. 5A is a block diagram illustrating an encoder in accordance with the present invention.
Figure 5B:
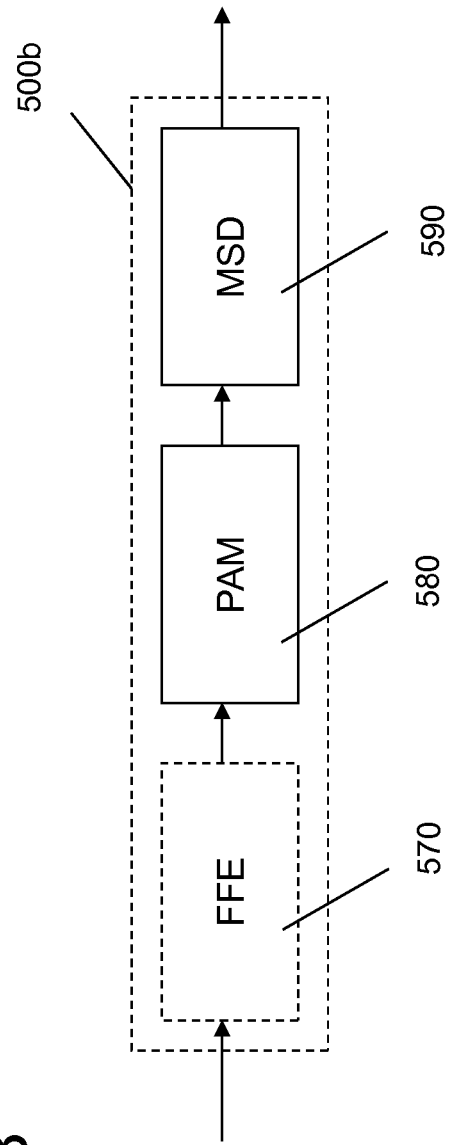
FIG. 5B is a block diagram illustrating a decoder in accordance with the present invention.

FIG. 5A and FIG. 5B illustrate the respective encoder 500a and decoder 500b, which may form a part of the transmitter digital circuit 110 and the receiver digital circuit 190 as shown in FIG. 1. In particular, the encoder 500a is input a digital bit sequence, which is then encoded by a multi-level coset coding (MLCC) 510. The coded MLCC symbols are then modulated by a time-domain modulation such as an M-ary pulse amplitude modulation (M-PAM), which is considered here to be a part of the MLCC coder 510, and the PAM symbols are further pre-coded by a pre-coder 530. The decoder 500b includes a time-domain demodulator 580 for demodulating the receiver signal and an multiple-stage decoder 590 for decoding the demodulated symbols. If THP was not applied, FFE 570 may be employed as an equalizer (cf. FIG. 31B and the description below). If THP was applied (cf. FIG. 31A), FFE may equalize the cursor and the post-cursor of the channel impulse response, as well as whiten the noise. In such a case, 570 is the feed-forward filter 340 of THP structure.

Figure 6:
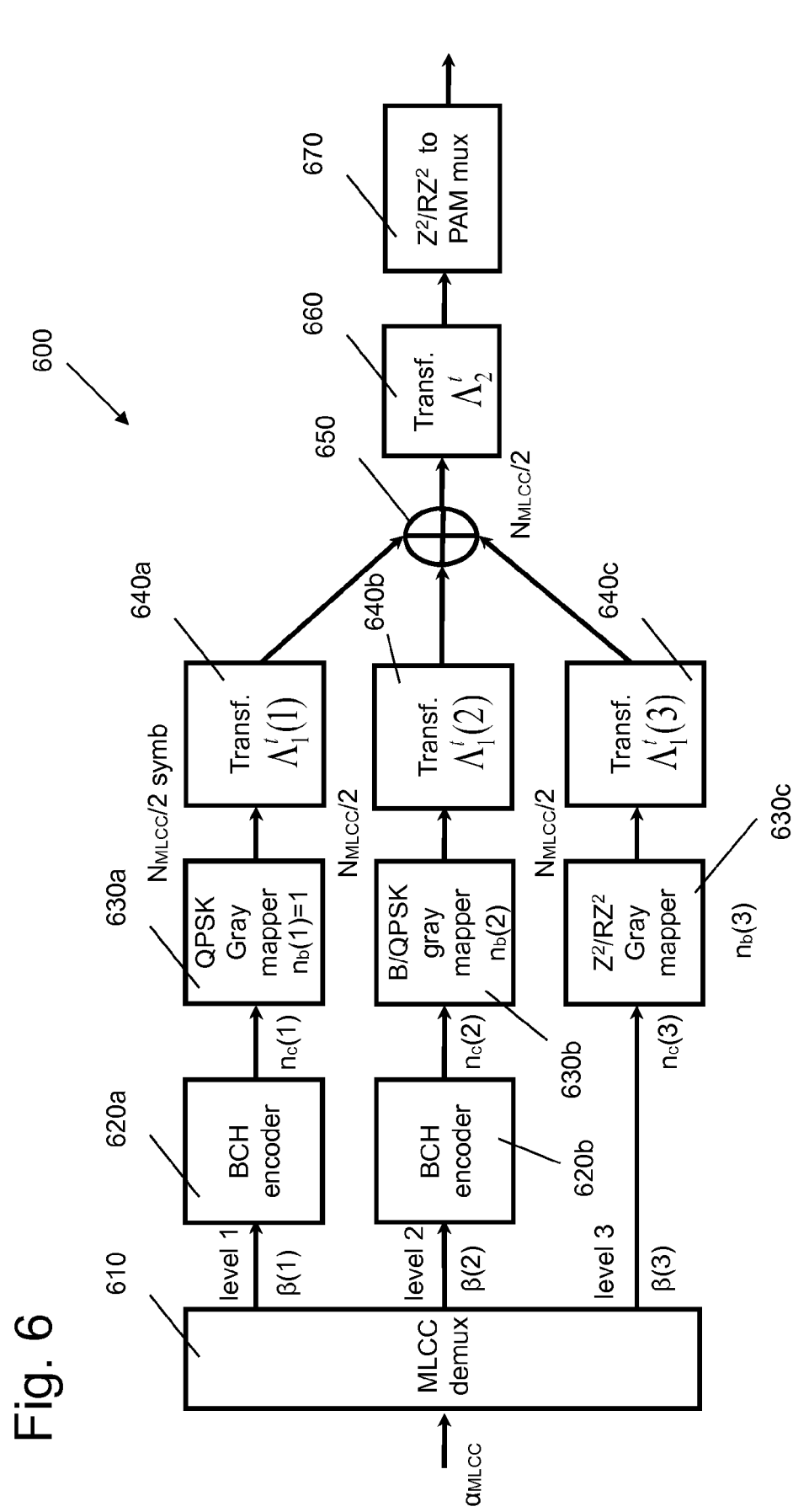
FIG. 6 is a block diagram showing a transmitter with a three level coset coding and modulation in accordance with an embodiment of the present invention.

FIG. 6 illustrates an MLCC encoder 600 which may be employed in place of the MLCC encoder 510 shown in FIG. 5A in accordance with the present invention. The encoder 600 is input a bit sequence x of information of length $\alpha_{MLCC}$ belonging to one MLCC codeword to be transmitted. The number of bits $\alpha_{MLCC}$ may be selected in accordance with the desired spectral efficiency with regard to the channel quality. The information bits x to be coded as an MLCC codeword are first split in a MLCC demultiplexer 610 into three MLCC levels. In particular, a portion of information with $\alpha_{MLCC}$ bits is split into portions having respectively $\beta(1)$, $\beta(2)$, $\beta(3)$ bits, each of which is input to a corresponding MLCC level, wherein $\alpha_{MLCC}=\beta(1)+\beta(2)+\beta(3)$. The amount of information bits input per level is configurable as a function of adaptive spectral efficiency as will be shown later. The order of bits is to be established to minimize latency at the MSD receiver. Assuming an input vector $x=[x_0, \ldots, x_{\alpha_{MLCC}-1}]$ to the splitter 610, after demultiplexing, the input into the first level is $y_1=[x_0, \ldots, x_{\beta(1)-1}]$. The second and third level streams are included as a function of the spectral efficiency configuration (by imputing therein a non-zero number of input bits). In particular, the second level may be input the vector $y_2=[x_{\beta(1)}, \ldots, x_{\beta(1)+\beta(2)-1}]$ (when a non-zero number of bits is to be present) and the third level may be input the vector $y_3=[x_{\beta(1)+\beta(2)}, \ldots, x_{\alpha_{MLCC}-1}]$ (when a non-zero number of bits is to be present).

The first two levels of the MLCC encoder include forward error correction coding 620a and 620b. The third level is uncoded. The forward error correction coder 620a encodes the $\beta(1)$ bits into $n_c(1)$ coded bits, while the forward error correction coder 620b encodes the $\beta(2)$ bits into $n_c(2)$ coded bits. In the uncoded third level, analogously $n_c(3)=\beta(3)$. In particular, as the MLCC forward error correction component codes, the BCH codes were selected as discussed above. The selection of particular binary BCH codes for each level is critical to guarantee performance and to avoid error-floor of the MLCC scheme as will be shown later.

The first level BCH coding 620a is always performed. The resulting codewords with $n_c(1)$ bits are then mapped by means of a QPSK gray mapper 630a, which mapps with number of coded bits per dimension $n_b(1)=1$ bit/dim. In accordance with an advantageous embodiment of the present invention, $n_c(1)=2044$ is the length of the BCH codeword, while number of information bits per codeword $k_c(1)=\beta(1)=1637$ bits is the length of the information word before encoding.

The second level may employ two different BCH codes in order to provide scalability of the spectral efficiency by means of mapping with $n_b(2)$ of either 0.5 or 1 bit/dim. Alternatively, $n_b(2)$ may be zero, in which case also $\beta(2)=0=\beta(3)$. Thus, in such a case, no coding is performed on the second level. The primitive polynomial of both BCH codes in the second level is the same for both configurations of $n_b(2)$ and shortening of the BCH code is performed to accommodate information bits belonging to the second level to the configured spectral efficiency. Thus, the code rate of the BCH code remains substantially the same, whereas its codeword length changes. In particular, the code rate $r_c(l)$ for the $l^{th}$ level is defined as a ratio of the number of information bits per codeword and the length of the codeword: $r_c(l)=k_c(l)/n_c(l)$. Spectral efficiency $\eta$ is then defined as $$\eta = \sum_{i=1}^{3} n_b(i) r_c(i).$$

For $n_b(2)=0.5$ bit/dim, a binary phase shift keying (BPSK) mapper 630b is used, while for $n_b(2)=1$ bit/dim, a quadrature phase shift keying (QPSK) mapper is applied. In accordance with the advantageous embodiment of the present invention, the BCH code for $n_b(2)=1$ bit/dim is a (2044, 2022) code and the BCH code for $n_b(2)=0.5$ bit/dim is a (1022, 1000) code. Here, the first number refers to a number of bits of the codeword output from the respective BCH coder and the second number refers to the number of bits of the information word on the input of the respective BCH coder.

The third level always remains uncoded for any configuration and the $\beta(3)$ bits are directly mapped 630c into a configurable $Z^2$ or $RZ^2$ constellation.

After the above described mapping, each level produces the same number of symbols per two dimensions $N_{MLCC}/2$. The lattice transformations 640a, 640b, and 640c are defined to implement Ungerboeck partitioning. After addition 650, the symbols are contained in $Z^2$ irrespectively of the spectral efficiency configuration selected. Furthermore, a next lattice transformation 660 results in a final zero-mean two dimensional square constellation over $Z^2$ or $RZ^2$ lattice, depending on the configured spectral efficiency. Finally, the PAM modulator 670 generates PAM symbols based on the two dimensional square constellation.

In the following, the above mentioned mappers and lattice transformations are described in more detail in accordance with an embodiment of the present invention. It is noted that although the following architecture provides an advantage of an efficient implementation, for instance, in an integrated circuit, the present invention is not limited thereto and any alternative implementation of these functions may be employed.

Figure 7:
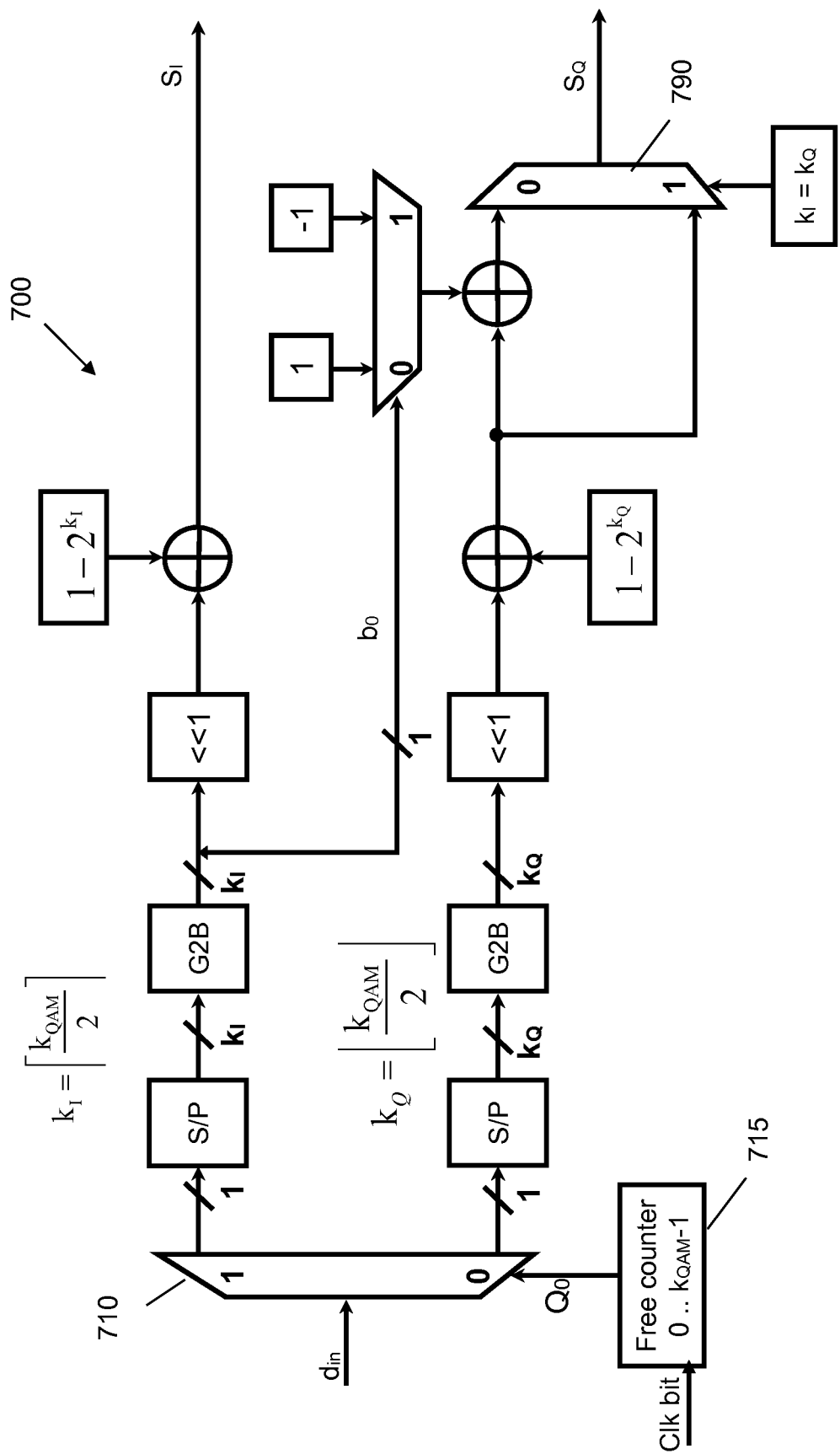
FIG. 7 is a block diagram illustrating an example architecture of a mapper.

The mappers map bits onto points of a predefined constellation. FIG. 7 shows an architecture of a mapper 700 which may be deployed to implement mappers 630a, 630b, and 630c in all three MLCC levels. For the i-th level (i=1, 2 or 3) $k_{QAM}=2 \cdot n_b(l)$ bits per 2 dimensions. In particular, for $k_{QAM} \leq 2$ the mapper works as follows.

The input bit stream is demultiplexed into two substreams. One of the substreams maps onto the In-phase (I) component of the two-dimensional constellation and the other substream maps onto the quadrature (Q) component of the constellation. The in-phase component correspond to a real part of a complex symbol and the quadrature part corresponds to an imaginary part of the complex symbol. The consecutive input bits $d_{in}$ are assigned to the respective components in accordance with the configuration of $k_{QAM}$. The demultiplexer 710 is controlled by the least significant bit of a free counter 715 counting from 0 to $k_{QAM}-1$ clocked at the same input bit rate. If $k_{QAM}$ is even, the same number of bits are assigned to each component. If it is odd, the in-phase component receives more bits that the quadrature component. Thus, the number of bits per dimension assigned to each component is $$k_I = \left\lceil \frac{k_{QAM}}{2} \right\rceil, \text{ and } k_Q = \left\lfloor \frac{k_{QAM}}{2} \right\rfloor,$$

wherein $\lceil . \rceil$ denotes rounding up and $\lfloor . \rfloor$ denotes rounding down. In the two substreams, the bits are then converted from serial to parallel (S/P) to symbols with $k_I$ and $k_Q$ bits in the in-phase and quadrature component, respectively. The right bit is the most significant bit. Then, a Gray-to-Binary converter (G2B) is applied.

Figure 8:
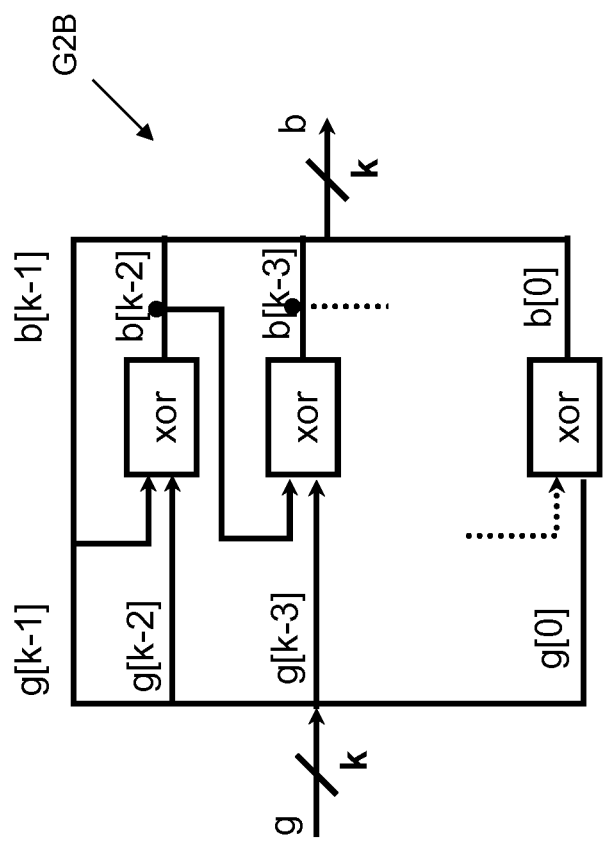
FIG. 8 is a block diagram illustrating an implementation of a Gray-to-Binary mapper.

An example of a Gray-to-Binary converter is shown in FIG. 8. The input bus g and output bus b are parallel buses with the width of k ($k_I$ and $k_Q$ respectively). The converter assigns for each $j \in [1, k-1]$:

$$b[k-1]=g[k-1]$$

$$b[k-1-j]=g[k-1-j] \oplus b[k-j]$$

wherein "$\oplus$" denotes the exclusive or (xor) operation, or modulo 2 addition. The integers resulting from the Gray-to-binary conversion are then processed as shown further in FIG. 7 by means of left and right shift (<<1 and >>1, respectively). The least significant bit $b_0$ output from the G2B in the in-phase component is used to control the multiplexer which sets 1 or −1 to the input of the last adder. Finally, the last multiplexer 790 outputs symbols to the quadrature branch in accordance with the kind of constellation. For constellations where $k_I=k_Q$, the arithmetic operations carried out on both branches (I and Q components) are same. This is the case, for instance, for square Gray Quadrature Amplitude Modulation (QAM) constellations. For $k_I>k_Q$, the Q branch is transformed to generate a rotated almost Gray QAM constellation, required to map an odd number of bits per two dimensions.

Figure 9:
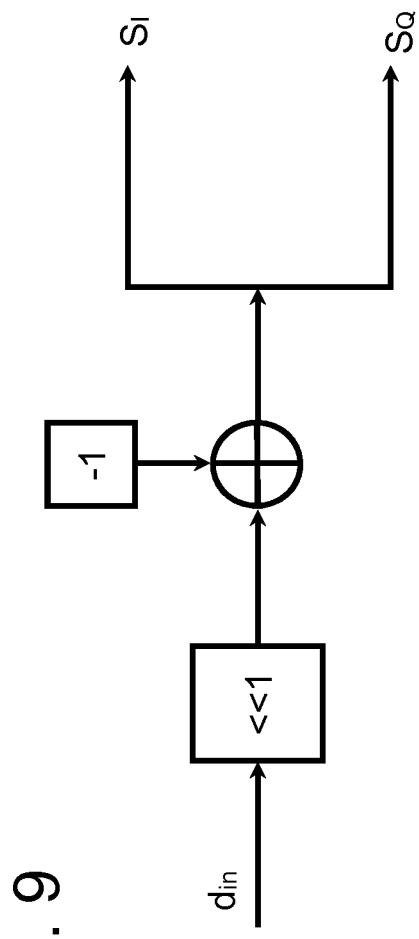
FIG. 9 is a block diagram illustrating an example architecture of a mapper for a special case.

A special case mapper is the mapper for $k_{QAM}=1$, which is used by the second and the third MLCC level when $n_b(2)$ and $n_b(3)$ is 0.5 bit/dim. Such mapper is illustrated in FIG. 9. The binary input stream $d_{in}$ is considered as a one-bit integer bus. The mapper assigns the same value for in-phase and quadrature component branches for each symbol. This corresponds to a Binary Phase Shift Keying (BPSK).

After the mapping, the symbols output from the respective mappers in each MLCC level are further transformed by a lattice transformation, which perform coset partitioning. The entire lattice transformation is composed by three sub-operations: 1) the lattice is translated to allow the constellation to be contained within the first two-dimensional quadrant, 2) the lattice is scaled to enable the coset partitioning by vector addition with the constellation of the other levels, 3) the lattice is rotated by 45 degrees before the vector addition for constellations with an odd number of bits per two dimensions.

The translation denoted here as $\Lambda_{1,1}{}^t(l)$ is defined for each $x \in C$ (x is a complex number), wherein $j=\sqrt{-1}$ and l denotes level of the MLCC, as $$\Lambda_{1,1}^t(l)(x) = \frac{1}{2}(x + (1+j)(2^{\lceil n_b(l) \rceil} - 1)).$$

Scaling and rotation are grouped into a single sub-operation denoted $\Lambda_{1,2}{}^t(l)$ and defined for each $x \in C$ as $$\Lambda_{1,2}^t(l)(x) = x \cdot 2^{\sum_{i=1}^{l-1} \lceil n_b(l) \rceil} \cdot \left(\frac{1+j}{2}\right)^{rem(2 \cdot n_b(l), 2)},$$

wherein operation "rem" denotes a reminder after an integer division. In particular, the above formula, it is a reminder of division of the first operand by the second operand (2).

The complete lattice transformation $\Lambda_1{}^t(l)$ including translation, scaling and rotation is defined as $$\kappa_1^t(l)(x) = \Lambda_{1,2}^t(l)(\Lambda_{1,1}^t(l)(x)).$$

Figure 10:
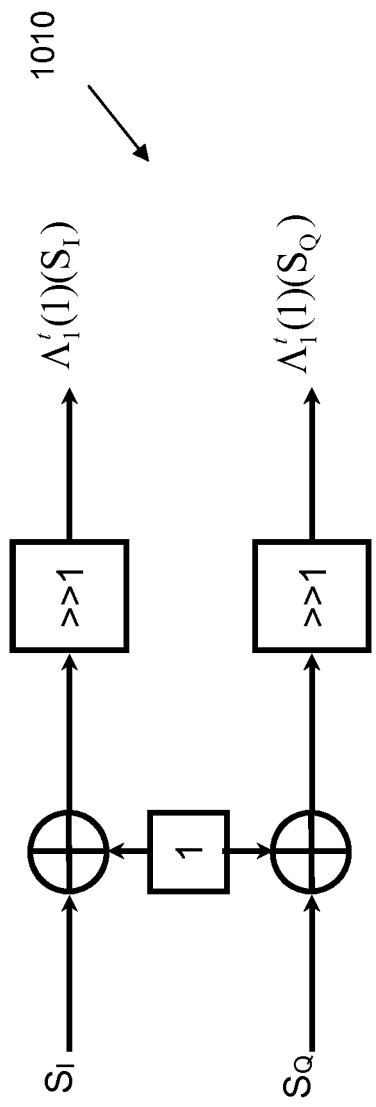
FIG. 10 is a block diagram illustrating an example of the lattice translation operation for a first level.

The lattice transformation 640a for the first level does not include scaling and rotation since $n_b(1)=1$ bit/dim. The corresponding lattice transformation architecture is shown in FIG. 10. The input and output signals for each component branch are considered integer numbers and arithmetic operations are defined with natural bus width increase. The output of the mapper, symbols $S_I$ and $S_Q$ are input to the lattice transformator 640a.

Figure 11:
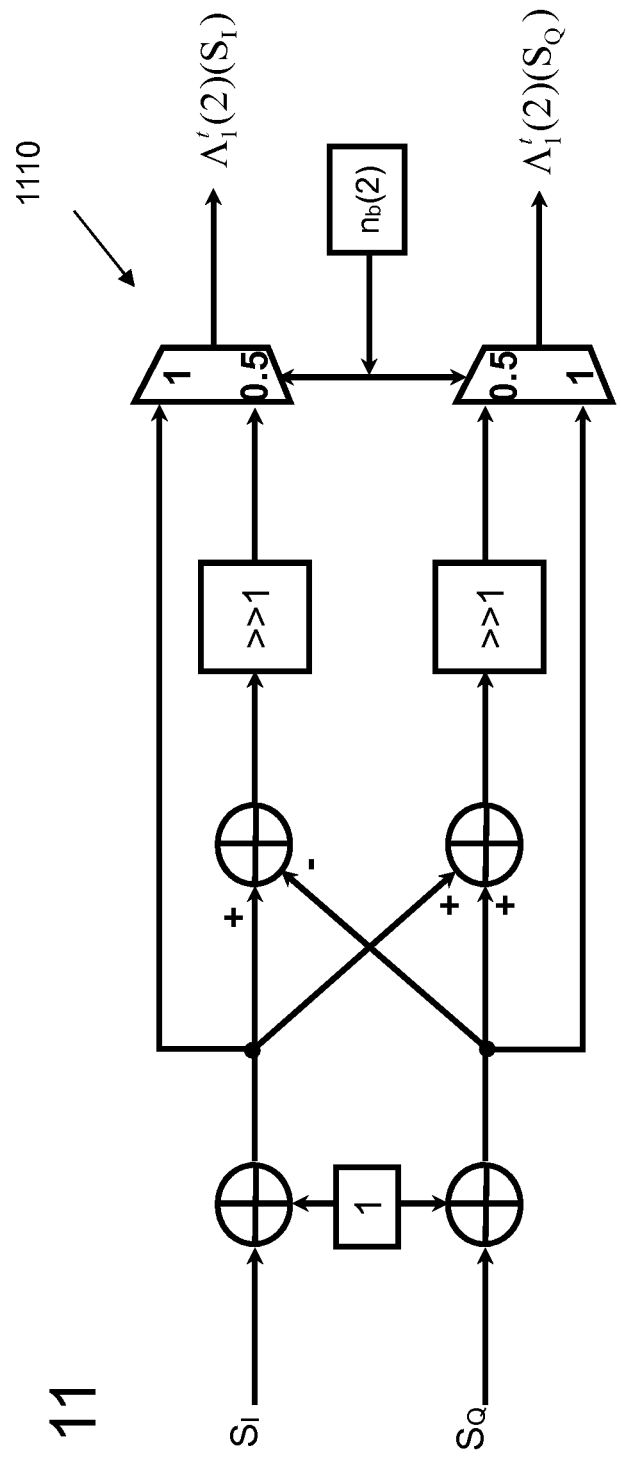
FIG. 11 is a block diagram illustrating an example of the lattice translation, scaling and rotation operation for a second level.

For the second level, two different cases are distinguished. For $n_b(2)=1$ bit/dim, rotation is not performed. For $n_b(2)=0.5$ bit/dim rotation is required since the corresponding 2D constellation maps 1 bit per two dimensions (odd number). The second level lattice transformation architecture is illustrated in FIG. 11. As can be seen from the figure, the value of $n_b(2)$ controls the multiplexer to perform or not the rotation.

Figure 12:
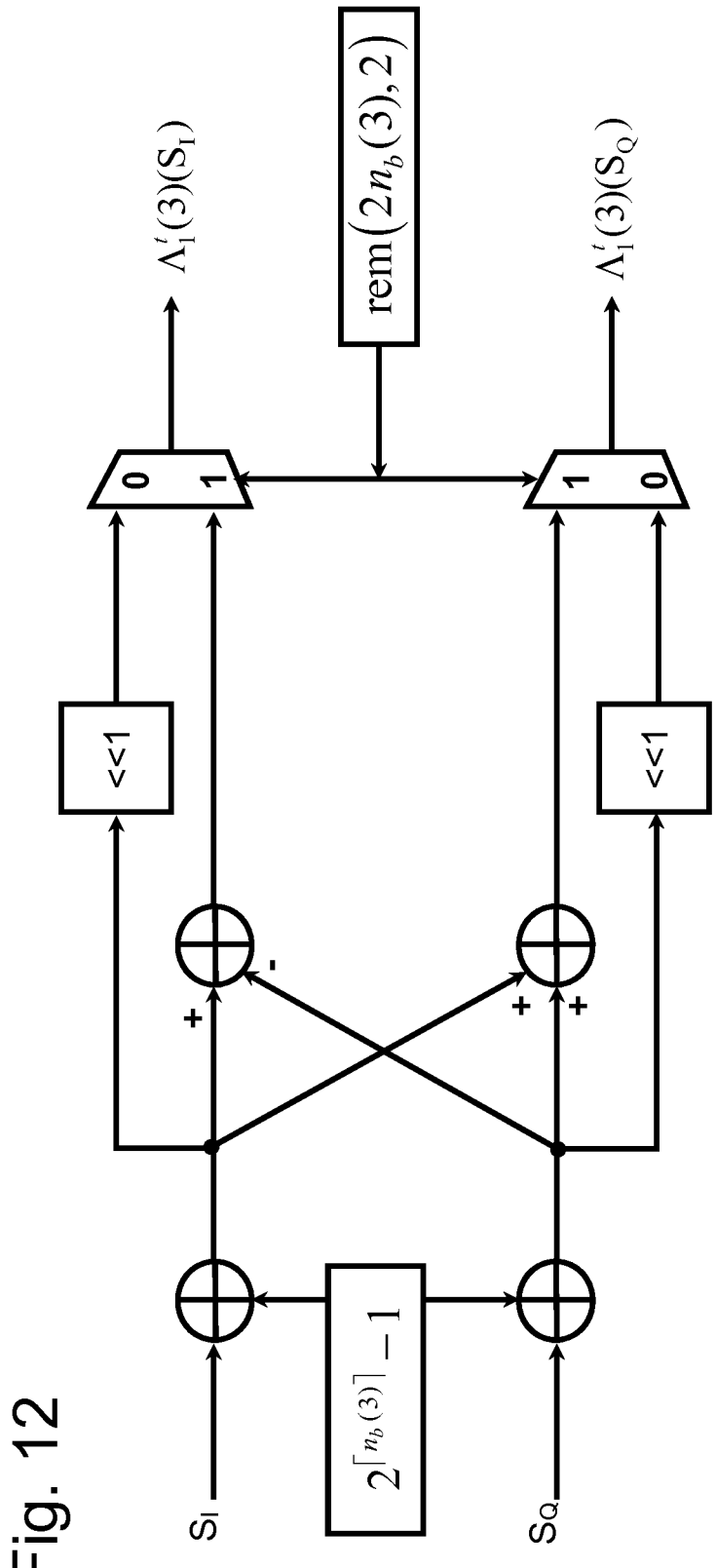
FIG. 12 is a block diagram illustrating an example lattice transformation for a third level.

The lattice transformation for the third level is shown in FIG. 12. Rotation is implemented for $n_b(3)$ values of 0.5, 1.5, 2.5, 3.5, . . . etc. bit/dim. For $n_b(3)=1, 2, 3, 4, \ldots$ etc., the rotation is disabled.

Figure 13:
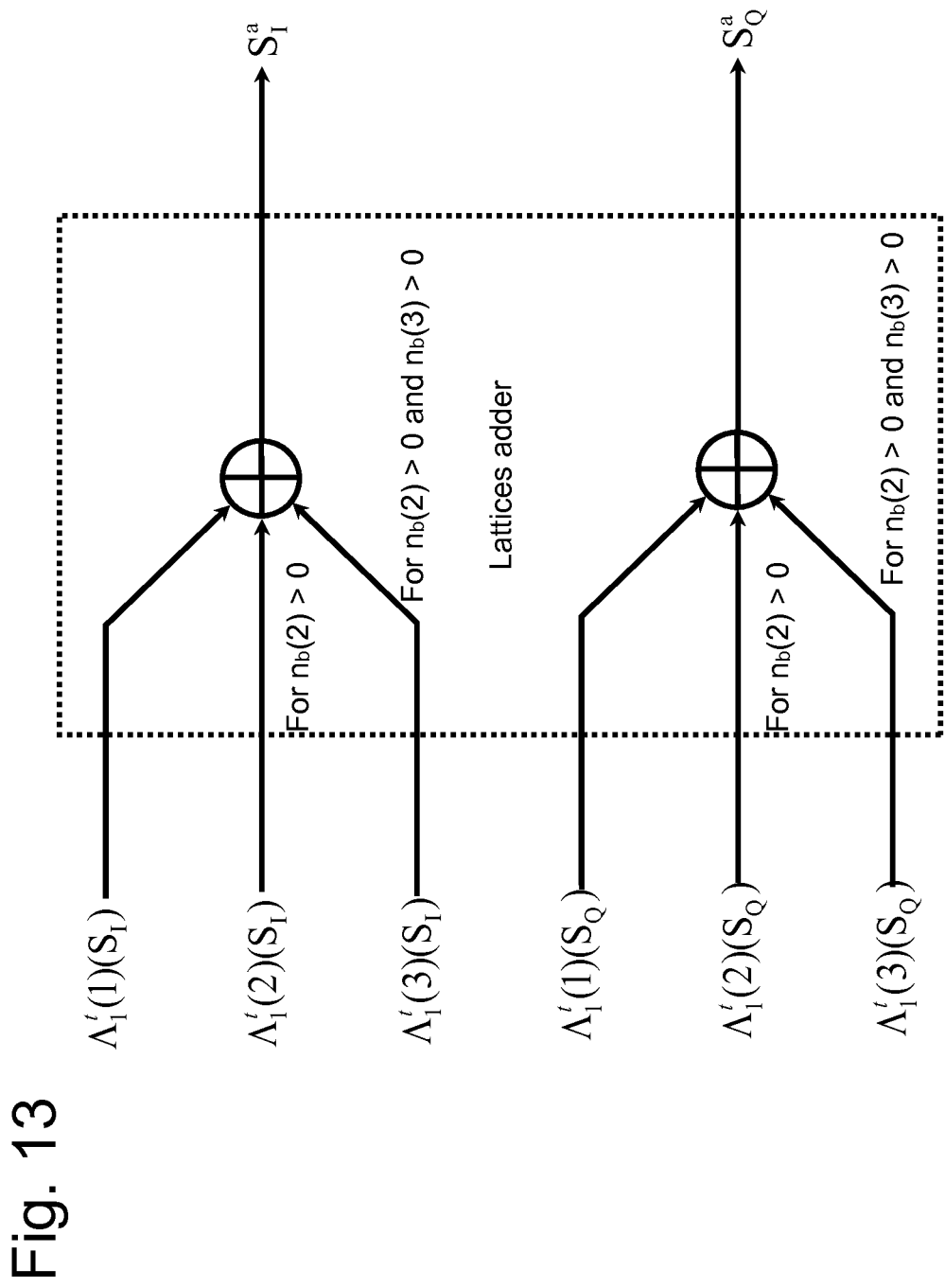
FIG. 13 is a block diagram illustrating an example of the lattice adder (vector addition) implementation.

After performing the lattice transformations 640a, 640b, and 640c, the lattice transformed symbols from each of the three levels are added 650 thus performing the coset partitioning over lattice $Z^2$ and the final partitioning. In particular, the in-phase and the quadrature components from the three levels are added separately to generate a respective new in-phase component $S_I{}^a$ and quadrature component $S_Q{}^a$ as illustrated in FIG. 13.

Figure 15:
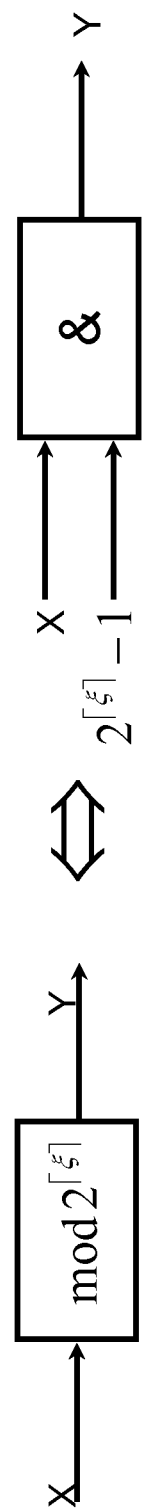
FIG. 15 is a block diagram illustrating an example implementation of a modulo operation.

The symbols with in-phase component $S_I{}^a$ and quadrature component $S_Q{}^a$ output from the lattice adder 650 are then further transformed in order to obtain the final zero-mean two-dimensional square constellation over $Z^2$ or $RZ^2$. The second step lattice transformation 660 includes the following three steps: 1) rotation by $-45$ degrees for $\xi=1.5, 2.5, 3.5, \ldots$ etc. bits per dimension (where $\xi=\sum_{i=1}^{3} n_b(i)$), 2) modulo operation which constraints the constellation symbols to a square region within the first 2D quadrant, 3) centering and scaling. In particular, the modulo operation is defined as $\mod(x,z)=x-n \cdot z$, where $n=\lfloor x/z \rfloor$, and where z is an integer power of two, and x is real. Since $z=2^{\lceil \xi \rceil}$, the modulo operation can be defined by means of a logic "and" operation as illustrated in FIG. 15. FIG. 15 shows the operation $y=\mod(x, 2^{\lceil \xi \rceil})$ performed equivalently as binary $y=x \& (2^{\lceil \xi \rceil}-1)$.

Figure 14:
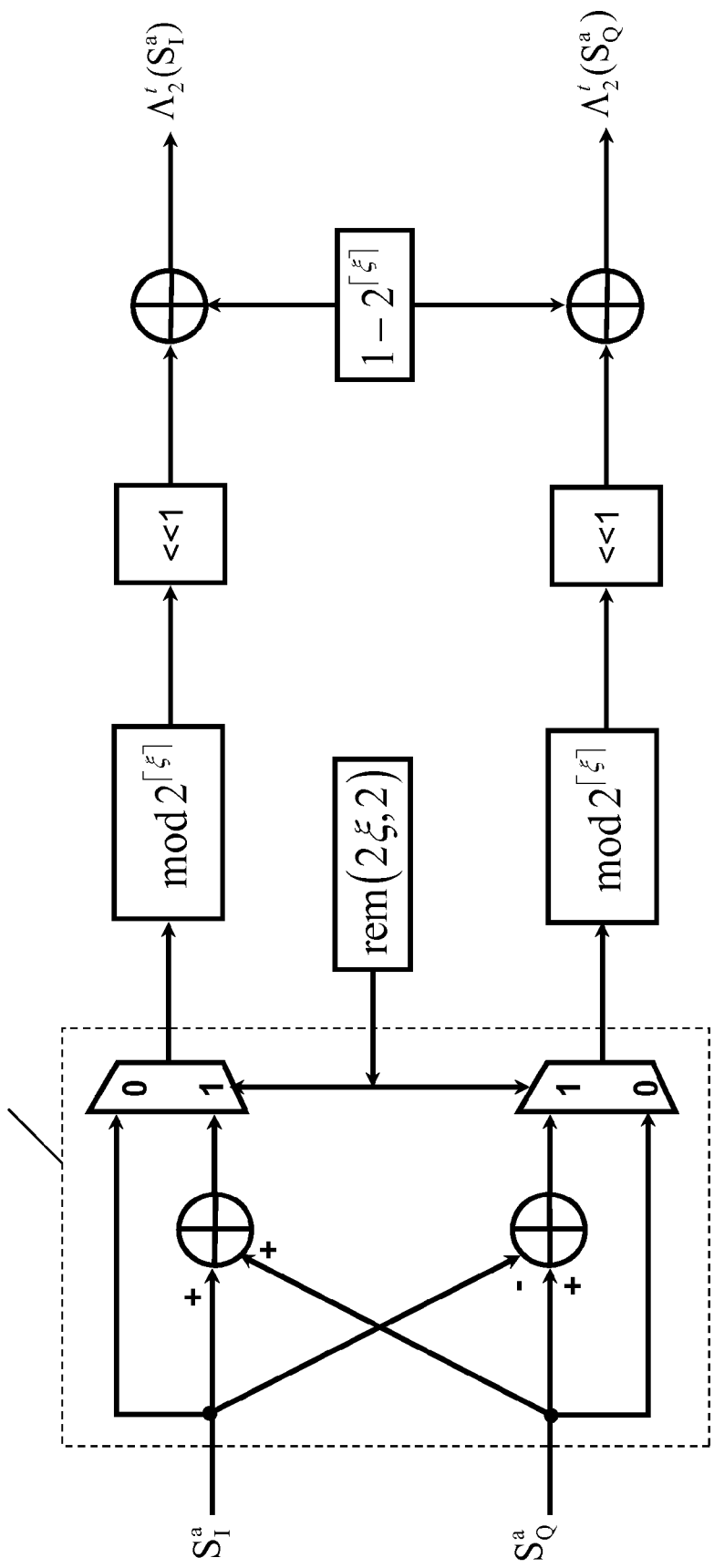
FIG. 14 is a block diagram illustrating an example of a second-step lattice transformation.

This lattice transformation is illustrated in FIG. 14. As can be seen in FIG. 14, the first part 1410 implements the rotation by $-45$ degrees as a function of the value of $\xi$. The modulo is applied afterwards to constraint the symbols to a square constellation in the first 2D quadrant. Then the scaling and centering of the constellation is performed, resulting in the final zero-mean square or rotated QAM constellation with the minimum distance of 2 or $2\sqrt{2}$, respectively. The transformed symbol components $\Lambda_2{}^t(S_I{}^a)$ and $\Lambda_2{}^t(S_Q{}^a)$ take odd values.

Figure 16:
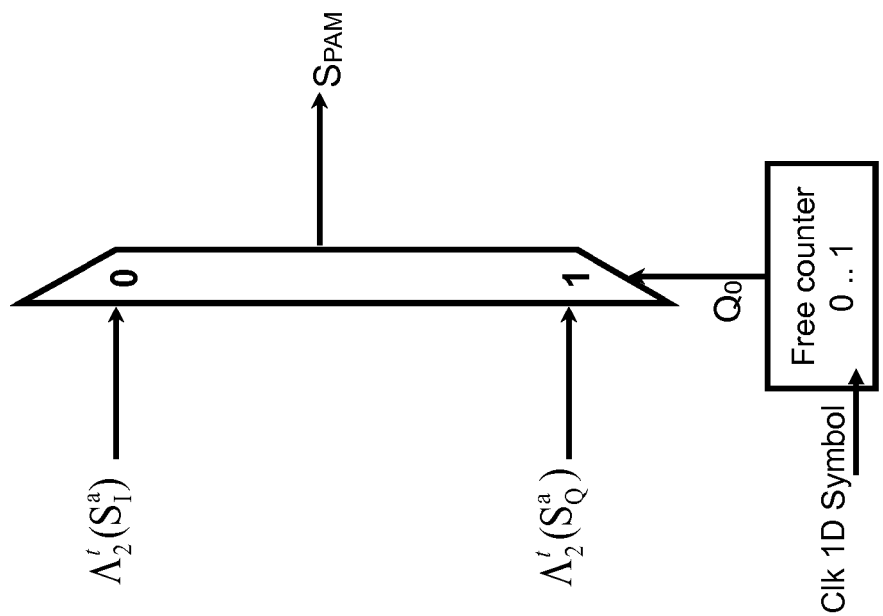
FIG. 16 is a block diagram illustrating M-PAM modulation output.

The in-phase and the quadrature components $\Lambda_2{}^t(S_I{}^a)$ and $\Lambda_2{}^t(S_Q{}^a)$ of the 2D symbols output from the second-step lattice transformation are then time domain multiplexed resulting in a sequence of 1D symbols belonging to a $2^{\lceil \xi \rceil}$-PAM constellation. These symbols are either directly transmitted to the communication channel or precoded, for instance by the THP as described above. The multiplexing operation is illustrated in FIG. 16. A free counter from 0 to 1 is clocked at the 1D symbol rate and controls the input of the multiplexer to take alternatingly the in-phase and quadrature input symbols.

The $2^{\lceil \xi \rceil}$-PAM constellation may also be transformed to generate a difference M-PAM constellation as it is illustrated in FIG. 32 (modulator) and FIG. 33 (demodulator). In particular, the differential modulation scheme illustrated in these figures is designed so as to avoid modulo loss during multi-stage decoding. The differential modulator 3200 transforms M-PAM symbols 3201 from the alphabet $\{-M+1, -M+3, \ldots, M-3, M-1\}$, where $M=2^k$, to differential M-PAM symbols 3202 from the alphabet $\{-M+1, -M+3, \ldots, M-3, M-1\}$. Accordingly, a dependency of a current differential symbol on a previously modulated symbol is created. Correspondingly, a demodulator 3300 transforms differential M-PAM symbols 3301 from the alphabet $\{-M+1, -M+3, \ldots, M-3, M-1\}$ to M-PAM symbols 3302 from the alphabet $\{-M+1, -M+3, \ldots, M-3, M-1\}$. Block denoted as $z^{-1}$ is a symbol delay element. Operation ">>1" is a right shift by one bit and "<<1" is a left shift by one bit.

Difference modulations are particularly suitable for AC (alternating current) coupled designed receiver circuits, and where absolute value of signal amplitude of input optical signal is destroyed, for instance as a consequence of high-pass filtering with a filter having lower cut-off frequency.

FIG. 17 shows a table with all valid configurations for the above discussed BCH codes, according to an advantageous embodiment of the present invention. The first column shows the number of 1D M-PAM symbols per output codeword from the entire MLCC. The second column shows number of input information bits per MLCC codeword. The third to fifth column specify respectively the number of bits per level to which the input information codeword is divided. The sixth column specifies the spectral efficiency corresponding to a respective configuration, whereas the seventh column shows the number of PAM states. The eighth to tenth columns specify number of coded bits per dimension in each level.

In the following, the mapping and lattice transformation effect on the symbol constellations are visualized. Assume $\xi=1.5$ bit/dim, $n_b(1)=1$ bit/dim, $n_b(2)=0.5$ bit/dim and $n_b(3)=0$ bit/dim (cf. second line of the Table in FIG. 17). After the respective mappers 630, the first-step lattice transformations 640, the lattices adder 650, and the second-step lattice transformation 660, an 8-QAM constellation over $RZ^2$ is obtained, which is further converted to 4-PAM.

FIG. 18 shows this step-wisely. In particular, under (a), the constellation of the first level after mapper 630a is shown and under (b), the constellation of the second level after the mapper 630b is shown. After the respective lattice transformation 640a and 640b, and after the vector addition 650, the coset partitioning is as shown under (c). Each one of the eight possible constellation points is obtained from the combination of a first level point 1801 and a second level point 1802. In particular, by lattice transformation 640a, the points of the first level have been scaled to obtain a minimum distance of 1 and translated to the first 2D quadrant. By lattice transformation 640b, the points 1802 of the second level have been rotated by 45 degrees and translated to the first quadrant with minimum distance 2. The first level thus divides the 2D space into four cosets, each corresponding to one original QPSK constellation point. The MSD at the receiver has to first decide which of the cosets was transmitted. When this coset is known, the next step is to decide between the two points 1802. The ratio between minimum constellation distance and noise standard deviation at the receiver is minimum for the first level (points 1801) and is increased twice for the second level. Thus, the first level requires a binary code with higher error correcting capabilities than the second level. The first level coset is decided for all symbols belonging to an MLCC codeword simultaneously, by means of hard-decision and BCH block decoding. Remapping of decoded BCH code-word is performed to obtain the first level coset before the second level decoding at the MSD. After the second-step lattice transformation 660, a zero-mean square constellation over $RZ^2$ is obtained as shown under (d) of FIG. 18.

Another example is illustrated in FIG. 19 for $\xi=2$ bit/dim. Similarly to the previous example, only the first and the second levels are used, $n_b(1)=1$ bit/dim, $n_b(2)=1$ bit/dim and $n_b(3)=0$ bit/dim (cf. third line of the Table in FIG. 17). In particular, under (a), the constellation of the first level after mapper 630a is shown and under (b), the constellation of the second level after the mapper 630b is shown (no rotation is applied in the second level). After the respective lattice transformation 640a and 640b, and after the vector addition 650, the coset partitioning is as shown under (c). After the second-step lattice transformation, the resulting zero-mean constellation is shown under (d) of FIG. 19, resulting in a 16-QAM constellation.

FIG. 20 illustrates another example configuration of the MLCC coder as described before. Now, $\xi=2.5$ bit/dim, $n_b(1)=1$ bit/dim, $n_b(2)=1$ bit/dim and $n_b(3)=0.5$ bit/dim (cf. fourth line of the Table in FIG. 17). This is the simplest configuration including all three levels. The constellation and the bit mapping for the first, second and third levels are illustrated under (a), (b), and (c). Under (d), the coset partitioning as performed by the first-step lattice transformations and the vector addition is shown. The first level splits the 2D points into 4 cosets (points 2001) and each first-level coset is further divided into other 4 cosets (point 2002) by the second level transformation. The MSD at the receiver decides the first-level cosets corresponding to every symbol. This provides an increase of 6 dB of SNR at second level decoding with respect to the first level. Then the MSD decides among 4 cosets providing other 6 dB SNR increase. The third level performs decoding with an SNR higher by 12 dB with respect to the first level since the minimum constellation distance has been increased by 4. The final constellation after transformation 660 with labeling is shown under (e) and corresponds to a rotated 32-QAM, the symbols of which are to be converted into 8-PAM symbols by the modulator 670.

FIG. 21 provides a fourth example configuration of the MLCC coder. Now, $\xi=3.5$ bit/dim, $n_b(1)=1$ bit/dim, $n_b(2)=1$ bit/dim and $n_b(3)=1.5$ bit/dim (cf. sixth line of the Table in FIG. 17). The constellation and the bit mapping for the first, second and third levels are illustrated under (a), (b), and (c). Under (d), the coset partitioning as performed by the first-step lattice transformations and the vector addition is shown. The final constellation after second step lattice transformation 660 with labeling is shown under (e), its symbols are to be converted into 16-PAM symbols by the modulator 670.

According to a preferred embodiment of the present invention, for Plastic Optical Fiber the BCH component codes with binary primitive polynomials over Galois field $GF(2^m)$ with m=11 are considered. The primitive polynomials of the first and second levels have advantageously 2047 bits length and a minimum shortening of 3 bits, resulting in $N_{MLCC}=2044$ 1D symbols on the output. In the above example of a transmission over POF described with reference to FIG. 6, as an advantageous embodiment, BCH (2044, 1637) in the first level and BCH codes with (2044, 2022) and (1022, 1000) in the second level have been applied.

The selection of binary BCH codes for each level is important to guarantee the performance and absence of the error floor of the presented MLCC scheme. In the following, selection of BCH codes is discussed in detail in order to guarantee the operation of the whole MLCC–MSD system at very low error rates as well as in order to obtain a possibly high coding-gain from the involved BCH codes. Performance of the BCH codes is estimated taking into account characteristics of a BCH hard-decision decoder as well as the modulo operations carried out by the MSD to separate the decoding of the three MLCC levels.

In order to estimate the performance of the MLCC based transmission system in accordance with the present invention, the Bit Error Rate (BER) as a function of Shannon gap of the whole MLCC is analysed under the following assumptions regarding the implementation of the Multi-Stage Decoder at the receiver:

Hard decision is implemented for the detection of symbols at each decoding level. For separating the received information corresponding to each level, modulo operators are implemented as defined in G. D. Formey et al., "*Sphere-bound-achieving coset codes and multilevel coset codes*", IEEE Trans. on Information Theory, vol. 46, no. 3, May 2000, pp. 820-850.

Bounded-distance decoding such as the Berlekamp-Massey Algorithm (BMA), is used for BCH decoding. BMA is widely used for BCH decoding in hardware implementations. Therefore the estimations presented here are an accurate estimate for performance achievable in real implementations.

The MLCC scheme is consider to be applied to an Additive White Gaussian Noise (AWGN) channel. The Inter-Symbol Interference is considered to be eliminated by means of a well designed equalizer. This is the case for Tomlinson-Harashima Precoding, but not for Decision Feedback Equalizer (DFE) or linear Feedforward Equalizer (FFE), because the error propagation results into coloured noise at the detector. Nevertheless, combination of the presented MLCC with FFE is suitable, although with a certain capacity loss produced by the detection noise autocorrelation. For THP, the coset partitioning presented above, has been designed in such a way that no modulo operation is required before Multi-Stage Decoding. Thus no additional loss is produced by a THP modulo.

The modulo operation is implemented at each level before the decoding. When all three levels are enabled (because the configured spectral efficiency is high enough), the modulo operators at the first two levels are implemented to separate the information directed to each one of these levels. The modulo operator at the third level has the same functionality which would be performed by the THP modulo after the Feed-Forward Filter, however, without any capacity loss. The modulo operation is implemented over a 1D lattice at the precoder (transmitter side), but it can be optimally decoded at the upper enabled decoding level of the MSD structure over a 2D lattice.

The performance prediction takes into account the shaping and modulo losses, but not the precoding loss incurred by THP. The MLCC scheme causes a shaping loss because the transmit signal is uniformly distributed (i.e. all the PAM symbols are equally probable) irrespectively of whether THP is applied or not. Since POF is a peak power limited channel, constellation shaping techniques lead to an increase of the crest factor resulting in reducing the channel capacity of the system. In fact, the true Shannon limit corresponds to the Sphere bound (also called Shaping limit). On the other hand, the modulo loss is considered in the evaluation of the symbol error probability at each decoding level.

Shannon showed that on an AWGN channel with a given SNR and a bandwidth B (Hz), the data rate R (bits/s) of a reliable transmission is upper-bounded by R<B·log$_2$(1+SNR). Equivalently, Shannon's result shows that the spectral efficiency (bits/s/Hz) is upper-bounded by η<log$_2$(1+SNR), or, given a spectral efficiency η, that the SNR needed for reliable transmission is lower-bounded by SNR>2$^η$−1. Let us define a normalized SNR parameter SNR$_n$ as SNR$_n$=SNR/(2$^η$−1). For any reliable coding scheme SNRn>1, i.e., the Shannon limit (lower bound) on SNR$_n$ is 1 (0 dB), independent of the spectral efficiency η. Moreover, SNR$_n$ measures the gap to the capacity, that is the difference in decibels (dB) between the SNR actually used by a coding scheme and the Shannon limit given on SNR for given η.

The normalized probability of symbol error per 2 dimensions is given by the following union bound estimate, as a function of the lattice Λ parameters and the noise variance, assuming AWGN and minimum distance detection:

$$P_{e,\Lambda} \approx \frac{2K(\Lambda)}{n} Q\left(\sqrt{\frac{d^2(\Lambda)}{4\sigma^2}}\right)$$

Here, d$^2$(Λ) is the minimum squared distance between points in the lattice, K(Λ) is the Kissing number of the lattice, n is the number of dimensions and σ$^2$ is the variance of an n-dimensional noise with volume V$_⊗$ (n,σ$^2$)≈(2πeσ$^2$)$^{n/2}$, i.e., a noise sphere of squared radius nσ$^2$Q(·) is the Gaussian probability of error function. This equation means that the normalized average probability of symbol error is a function of the ratio between the squared minimum distance and the variance of noise. This ratio, depending on the lattice and constellation used, is related with the SNR$_n$ in different manner. Kissing number is the average number of points at a minimum distance around a constellation point.

Coset partitioning is based on 2D lattices qZ$^2$ for QAM constellations, and qRZ$^2$ for rotated QAM constellations, where q is scaling factor that depends on level. For both lattices n=2.

For 2$^k$-QAM constellations, where k is even, d$^2$(qZ$^2$)=q$^2$, and the average constellation energy is $$E_{av} = \frac{q^2}{2}\frac{2^k - 1}{3}$$

From this, the SNRn is given by:

$$SNR = \frac{E_{av}}{2\sigma^2} = q^2 \frac{2^k - 1}{4 \cdot 3 \cdot \sigma^2}$$

$$SNR_n = \frac{q^2}{4 \cdot 3 \cdot \sigma^2}$$

Therefore, the average probability of symbol error is estimated as follows:

$$P_{es}(SNR_n) = K(\Lambda)Q(\sqrt{3 SNR_n})$$

The Kissing number is 4 for a very large constellation within the lattice. However, for small lattices, the average number of points at minimum distance is rather to be considered, since the boundary points typically have one half the inner points. Nevertheless, when modulo operators of MSD are implemented before the hard-detection and noise aliasing is produced, K(Λ)=4 is considered accurate, especially when THP is applied. For rotated 2$^k$-QAM constellations where k is odd, the following is an estimate for the symbol error probability. By series summation methods, the average constellation energy is calculated as $$E_{av} = \frac{q^2}{4}\frac{2^{2\lceil k/2 \rceil} - 1}{3}$$

and thus, the SNR$_n$ is given by:

$$SNR = \frac{E_{av}}{2\sigma^2} = q^2 \frac{2^{2\lceil k/2 \rceil} - 1}{8 \cdot 3 \cdot \sigma^2}$$

$$SNR_n = \frac{q^2}{8 \cdot 3 \cdot \sigma^2}\frac{2^{2\lceil k/2 \rceil} - 1}{2^k - 1}$$

and the symbol error probability is as follows:

$$P_{es}(SNR_n) = K(\Lambda)Q\left(\sqrt{6\frac{2^k - 1}{2^{2\lceil k/2 \rceil} - 1}SNR_n}\right)$$

The Kissing number will be considered to be 4 as for the k even QAM constellations.

From this, now the average symbol error probability for each decoding level involved in MSD may be calculated.

For the MLCC scheme configured with a total of ξ coded bits per dimension and spectral efficiency of η bits/Hz/s per dimension, the normalized SNR for each level l is defined as a function of the complete MLCC scheme SNR$_n$. When 2ξ is even, the SNR$_{n,l}$ is given by $$SNR_{n,l} = SNR_n \frac{2^{2\eta} - 1}{2^{2\xi} - 1} \cdot 4^{\sum_{i=1}^{l} n_b(i)}$$

assuming a current spectral efficiency of system (η) being lower or equal to the number of coded bits per dimension (ξ). Furthermore, it is assumed that the minimum constellation distance is increased at each level as a function of the sum of the number of coded bits per dimension at previous levels. When 2ξ is odd, we obtain:

$$SNR_{n,l} = SNR_n \frac{2(2^{2\xi} - 1)}{2^{2\lceil \xi \rceil} - 1}\frac{2^{2\eta} - 1}{2^{2\xi} - 1} \cdot 4^{\sum_{i=1}^{l} n_b(i)} = SNR_n \frac{2(2^{2\eta} - 1)}{2^{2\lceil \xi \rceil} - 1} \cdot 4^{\sum_{i=1}^{l} n_b(i)}$$

where the deviation due to rotated 2$^{2\xi}$-QAM constellation after Λ$_1$'(l) and Λ$_2$' has been considered.

Let denote the symbol error probability for level l as a function of normalized SNR as P$_{es,l}^0$(SNR$_n$) and the average bit error probability as $P_{eb,l}^0(SNR_n)$. The symbol error probability is then calculated as $$P_{es,l}^0(SNR_n) = 4Q(\sqrt{3SNR_{n,l}})$$

In order to obtain the bit error probability it must be evaluated how many minimum distance links between points produce only a 1-bit change at the mapping and how many produce a 2-bits change. For even QAM constellations, all the links have a 1-bit change, since they are Gray mapped. For odd QAM constellations it is more difficult, but it still can be calculate analytically—in a closed form. When $2 \cdot n_b(l)$ is even:

$$P_{eb,l}^0(SNR_n) = \frac{1}{2n_b(l)} P_{es,l}^0(SNR_n)$$

and when $2 \cdot n_b(l)$ is odd, the average bit error probability is estimated by:

$$P_{eb,l}^0(SNR_n) = \frac{3\sqrt{2^{2n_b(l)+1}} - 2}{4n_b(l)(\sqrt{2^{2n_b(l)+1}} - 1)} P_{es,l}^0(SNR_n)$$

Furthermore, for the coded levels (first and possibly second level described with reference to FIG. 6), the BCH decoding error probability may be estimated from $P_{eb,l}^0(SNR_n)$, because for both QPSK and BPSK constellations applied in these levels, only one bit fails per failed symbol decision at low error rate regime. For the l-th level, a BCH code ($n_c(l)$, $k_c(l)$, $t_c(l)$) over Galois field $GF(2^m)$ is defined, where $n_c(l)$ is the number of bits per code-word $n_c(l) \leq 2^m-1$ and is even, $k_c(l)$ is the number of information bits per code-word and $t_c(l)$ is the error correction capability in bits per codeword. BCH codes are designed separately for the first and second level, attending to different criteria.

For large enough BCH codes, the next equation accurately estimates the decoding bit error probability $P_{eb,l}^1(P_{eb,l}^0)$ as a function of the input bit error probability:

$$P_{eb,l}^1(P_{eb,l}^0) = \sum_{i=t+1}^{n} \frac{i}{n}\binom{n}{i}(P_{eb,l}^0)^i(1-P_{eb,l}^0)^{(n-i)}$$

This equation applies for the first and the second level BCH codes. The third level is uncoed and thus $P_{eb,l}^1 = P_{eb,l}^0$. An entire codeword is assumed erroneous when it cannot be corrected and the number the number of failed bits is from $t_c(l)+1$ to $n_c(l)$.

Using the above described estimations, it is now possible to estimate the bit error probability for the whole MLCC scheme decoded by MSD at the receiver, as a function of $P_{eb,l}^1$ in all the enabled MLCC levels, $L_{max}$ denoting the index of the highest level l that is enabled. The MLCC bit error probability is estimated as $$P_{eb}^{MLCC}(SNR_n) = \sum_{l=1}^{L_{max}} \frac{n_b(l)r_c(l)}{\eta} P_{eb,l}^1(SNR_n)$$

where $r_c(l)$ is the code-rate of each level, being always $r_c(3)=1$, since the 3rd level is uncoded.

Now, in accordance with an embodiment of the present invention, based on the above derived estimated bit error probability, the BCH codes are selected to ensure that the bit error rate (BER) of the entire MLCC-MSD system is less than a target BER denoted as $BER_0$. The target BER is a system requirement depending on the target application. For instance, for a 1 Gbps Ethernet, $BER_0=10^{-10}$, and for 10 Gbps, $BER_0=10^{-12}$. The method for selecting the BCH codes includes the following steps:

1. Selecting m, $N_{MLCC}$ and $n_c(1)$. For any level l, $\beta(l)=k_c(l)$ is optimum. Since $n_b(1)=1$ bit/dim for any MLCC configuration according to FIG. 6, $N_{MLCC}=n_c(1)$ one-dimensional symbols per MLCC code-word. On the other hand, for a BCH over $GF(2^m)$, choosing $n_c(1)$ as close as possible to $2^m-1$ will maximize the performance. The m is selected based on system requirements; the BCH coding gain increases with m. In addition $N_{MLCC}$ must be even since the MLCC works over a 2-dimensional lattice, and when rotated constellations are involved an odd number of bits will be mapped per 2 dimensions. Therefore:
  1.1 m is selected as a function of the system requirements, taking into account that with a higher m, the coding gain increases as well as the decoding complexity and latency.
  1.2 $n_c(1)$ is an even integer such that $n_c(1)<2^m-1$. In order to maximize the coding gain, $n_c(1)$ must be selected as high as possible.
2. Selection of $r_c(1)$. The next step is the code-rate selection for the BCH used at the first level. From the performance point of view, for a given m and $n_c(1)$, there is an optimum value $r_c(1)$ for which the Shannon gap is minimum. BCH codes perform very well for high code-rates. As the code-rate is decreased from 1 down to 0, the Shannon gap is decreased, then the coding-gain increases up to a given value $r_c(1)_{opt}$. From this value the gap monotonically increases. For $r_c(1)$ selection, hardware implementation constraints must be considered as well. The computational complexity, hence the silicon area, of the BCH BMA decoder is proportional to $m \cdot t$ factor.
3. Calculation of $k_c(1)$ and the primitive polynomial. BCH code ($n_c(1), k_c(1), t_c(1)$) is a shortened version of a BCH code ($2^m-1, k_{c0}(1), t_{c0}(1)$), where $k_{c0}(1)=k_c(1)+2^m-1-n_c(1)$. From this first tentative value, we search for the valid primitive polynomial with $k \leq k_{c0}(1)$. From this, the BCH is closely defined by $n_c(1)$ and $k_c(1)=k+n_c(1)-2^m+1$.
4. Selection of BCH for the second level: two different BCH codes are used in the second level, however they are shortened version of an unique primitive polynomial, so, advantageously, only one BCH decoder requires to be implemented for this level. When $n_b(2)=1$ bit/dim, then $n_b(2)=n_c(1)$. For $n_b(2)=0.5$ bits/dim, $n_b(2)=n_b(1)/2$. If $k_{c0}(2)$ is the number of information bits of primitive polynomial, $k_{c0}(2)$ is the highest value that fulfills $$P_{eb}^{MLCC}(SNR_n) \approx \frac{n_b(1)r_c(1)}{\eta} P_{eb,1}^1(SNR_n)$$

when $P_{eb}^{MLCC}(SNR_n) > BER_0$ for $n_b(2)=0.5$ bit/dim and $n_b(1)=1$ bit/dim. In other words, the performance of the whole system is established by the first level. This is an iterative process that requires calculating numerically the above equations. Once a valid $k_{c0}(2)$ is found, $k_c(2)$ is calculated as $k_c(2)=k_{c0}(2)+n_c(2)-2^m+1$.

An example of the BCH code selection according to the above introduced rules is shown in the following. The exponent of the primitive polynomial of m=11 is selected as providing a good performance-complexity tradeoff for multi-gigabit POF applications. Furthermore, $N_{MLCC}$=2044 symbols per MLCC code-word, and therefore $n_c(1)$=2044 bits. $BER_0=10^{-12}$ to fulfill a 10 Gbps requirement. In order to select the code rate, $P_{eb}^{MLCC}(SNR_n)$ is calculated with $n_b(2)$= $n_b(3)$=0, for several values of $r_c(1)$.

FIG. 22 shows the corresponding BER curves. As can be seen from this figure the Shannon gap decreases as $r_c(1)$ is goes down from 0.95 to 0.8, wherein for $r_c(1)$=0.80, the Shannon gap is in minimum. It increases further for $r_c(1)$=0.7 and 0.6. Therefore, BCH (2044,1637) is selected for the first level.

For the selection of the second-level BCH code, at first the case, where BCH is not employed, is considered, namely $r_c(2)$=1 and $n_b(2)$=1 bit/dim. FIG. 23 shows the bit error rate $P_{eb,1}^1(SNR_n)$ for the first and second levels, as well as the performance of the whole MLCC in terms of $P_{eb}^{MLCC}(SNR_n)$. The spectral efficiency is $\eta$=1.8 bits/s/Hz/dim. As can be seen, the MLCC BER is conditioned by the second level for BER<$10^{-7}$.

When the configuration is changed and $t_c(2)$=1 bit, the performance changes as shown in FIG. 24. As can be seen, the performance of the entire MLCC is now nearer to the Shannon bound. FIG. 25 illustrates the performance for $t_c(2)$=2 bits per BCH code-word. This configuration is valid also for $n_b(2)$=0.5 bits/dim as shown in FIG. 26. FIG. 27 shows the performance for $\eta$~3.3 bits/s/Hz/dim and $\xi$=3.5 bits/dim, with $n_b(1)$=$n_b(2)$=1 bit/dim and $n_b(3)$=1.5 bits/dim. As already discussed above, the performance of the third level does not have an influence on the performance when the BCH codes are well selected for implementable $BER_0$.

As already mentioned above, the link power budget is an important measure of quality of an optical communication system. It measures the maximum attenuation at which the communication system still can guarantee a given data rate with a bit error rate less than a specified target (under a defined conditions of noise, distortion, temperature, etc.) The aim is to select and develop the more suitable telecommunication techniques that lead to maximizing of the link power budget. This problem is related to the aim of approaching the capacity of the communication channel for which the system is designed. Therefore, information theory criteria and bounds may be used to estimate the optimal baud-rate and number of levels of M-PAM that maximize the link budget as discussed above.

Following example consider that THP is implemented as equalization technique together with the MLCC scheme of the present invention. Aim is to provide 1 Gbps using an LED with wavelength width FWHM of 20 nm, numerical aperture FWHM of 0.3 (with launching condition similar to EMD) and OMA of 0 dBm. Several analog −3 dB electrical bandwidths of the LED are considered in order to show how the link budget depends thereon. The link budget is for 50 meters of SI-POF (A4a.2) and POF attenuation is included within the link budget. In other words, POF response is considered DC normalized, all modal dispersion and the consequent ISI being included in the link power budget evaluation. A commercially available integrated large area optical receiver is considered. The responsivity is 0.5 A/W at 650 nm wavelength and the trans-impedance is adjusted to optimize the noise bandwidth tradeoff as a function of the baud-rate and the number of modulation levels.

FIG. 28 shows the link budget (dBo) as a function of the signal baud-rate (Fs). As it can be seen, the baud-rate that maximizes the link budget is around 300 MBaud, for LED bandwidths between 50 and 100 MHz, and something more than 350 MBaud for 350 MHz. Therefore, a signal bandwidth around 150 MHz and 16-PAM modulation, providing a spectral efficiency of ~3.3 bits/symbol (6.6 bits/s/Hz) are the configuration to maximize the link budget. When link power budget is exhausted because there is excess attenuation due to bad coupling, bad termination, intermediate connectors or too many bends, there are two possibilities: do not establish the communication link or reduce the data-rate (e.g. 800 Mbps from 1 Gbps) by means of an automatic algorithms implemented in the system. From the final user point of view, the adaptive bit-rate solution may be the key for the success, especially for amateur (easy-to-install requirement) installations, that probably will be the prevailing in the home network installations. On the other hand, keeping in mind cabling topologies like daisy-chain or tree, which reduce the installation complexity within the home, the adaptive bit-rate capability can be advantageous in common sections of the network (sections that must cope with the traffic from several other sections), where more than 1 Gbps may be needed and provided due to possible excess margin. The present invention employs an MLCC scheme which supports programmable spectral efficiency for adaptive bit-rate.

FIG. 29 summarizes a method according to the present invention. Accordingly, bits are input 2810 into the three-level coset coder and split into its three levels. The bits in the first and the second level are coded 2820 by the BCH code. The coded bits from the first two levels as well as bits in the third level are then mapped onto respective predefined constellations 2830 and the resulting symbols are then transformed 2840 by means of a lattice transformation, performing in this way the coset partitioning. The lattice transformed symbols from each level are added and processed by a second step lattice transformation 2850 in order to obtain a zero-mean constellation with possibly uniform distribution of energy. After the three-level coset coding, the symbols are modulated 2860 and either provided for transmission, or pre-coded 2870.

FIG. 30 shows an example multi-stage decoder 3000 which may be used to decode signal encoded as described above. First, the encoded digital signal (M-PAM) having a length $N_{MLCC}$ is demodulated 3010 to obtain a 2 dimensional symbol codeword with length $N_{MLCC}/2$. The demodulated symbol is then transformed 3020 by an inverse lattice transformation (matching the second lattice transformation 660 of the encoder) and decoded with a three-stage decoder. The three-stage decoder applies at the first stage another inverse lattice transformation 3030a (matching the lattice transformation 640a at the encoder) and hard decision 3040a, then extracts a first portion of the transformed symbol codeword by applying a modulo operation 3050a (mod-$\Lambda_1$) to the demodulated symbol. Then, still at the first stage, the extracted first portion is demapped 3060a (matched to mapping 630a at the encoder) to obtain $n_c(1)$ bit long BCH codeword, which is decoded with a first BCH decoder 3070a (matched to the BCH coder 620a at the encoder) to obtain $\beta(1)$ information bits. The decoded codeword of the first portion with $n_c(1)$ bits selects a first coset. The decoded codeword of the first portion is then mapped back similarly as 630a and transformed by a lattice transformation corresponding to 640a. The resulting first-level coset is then subtracted from the symbol codeword and the second portion is obtained in the second stage by applying modulo operation (mod-$\Lambda_2$) thereto after an inverse lattice transformation and hard decision, which are similar to functional blocks described for the first stage. The second portion is then demapped (matched to mapping 630b at the encoder) to obtain $n_c(2)$ bit long BCH codeword, which is decoded with a second or a third BCH decoder (corresponding to BCH coder 620b at the encoder) to obtain β(2) information bits. The decoded codeword of the second portion selects a second coset. A third portion with a size of $n_c(3)=\beta(3)$ bits is obtained by subtracting the decoded codeword of the second coset (mapped 630b and lattice-transformed 640b again) and the first-level coset from the demodulated symbol and by inverse lattice transformation (corresponding to lattice transformation 640c at the encoder), hard decision 3040c and modulo operation (mod-$\Lambda_3$) 3050c. After a demapping 3060c (corresponding to mapping 630c at the encoder), based on the obtained third portion the codeword is finally decoded by multiplexing 3080 (MLCC mux) the decoded three parts obtained at three decoder stages to obtain the decode word of length $\alpha_{MLCC}$.

FIGS. 31A, 31B, and 31C show possible equalization methods which may be used with the present invention. Advantageously, as described above, Tomlinson-Harashima precoding is used, including modulo operation 3110 and feedback filtering 3130, similarly to the known precoding as illustrated in FIG. 3 (cf. modulo operation 310 and feedback filter 330). However, at the decoder side, the modulo operator 320 from FIG. 3 is advantageously left out in order to reduce modulo loss, and in view of the modulo operation being performed during the multi-stage decoding. Thus, before entering the multi-stage decoder (for instance the decoder of FIG. 30), only feed-forward filtering 3120 is performed.

Alternatively, when Tomlinson-Harashima precoding is not applied, a feed-forward equalization may be performed as shown in FIG. 31B. Still alternatively, decision feedback equalizer may be employed as shown in FIG. 31C.

FIG. 34 summarizes method steps as performed in accordance with an embodiment of the present invention. A step 3410 of equalization may be performed on the symbols received from the POF channel. This step may include feed-forward filtering as illustrated in FIGS. 31A, 31B, and 31C. Then, the symbols are demodulated 3420, for instance, by a M-PAM demodulator. An inverse lattice transformation 3430 is then applied to the demodulated symbols, which then undergo the three-stage decoding with corresponding steps 3440, 3450, and 3460. Basically, in each of these stages, the symbols are inverse lattice transformed, decision on their value is performed (corresponding to "hard decision" in FIG. 30), a portion of data designated coset/codeword is extracted by means of a modulo operator and at the first and/or second stage, BCH decoding is performed. The so obtained portions from the first, second and third stage are then (binary) multiplexed 3470.

In particular, the present invention may be deployed in home networks for the emerging IPTV implementations which require high bandwidth and high Quality of Experience. However, the present invention may also be employed in access networks, for instance for delivering a high-definition broadcast via a fiber-to-the-home directly to the user in the last part of the transmission way. Thanks to the inherent characteristics of the plastic fiber (low cost and time of installation, no plug to attach, EMI immunity, low diameter, etc) and the features of the present invention, POF can be considered as a long term alternative for future access network architectures. POF in connection with the data transmission technology as provided by the present invention may also be advantageously used in the industrial environment and in automotive infotainment networks. Higher bandwidth demands required by video based sensors are achievable with POF and the above described technology, enabling the installation of high-definition rear view cameras, multi-camera 360° view, parking assist, wing mirror replacement, backseat monitoring, night vision, etc. in a cost efficient way.

Another embodiment of the invention relates to the implementation of the above described various embodiments using hardware and software. It is recognized that the various embodiments of the invention may be implemented or performed using computing devices (processors). A computing device or processor may for example be general-purpose processors, digital signal processors (DSP), application specific integrated circuits (ASIC), field programmable gate arrays (FPGA) or other programmable logic devices, etc. The various embodiments of the invention may also be performed or embodied by a combination of these devices.

Further, the various embodiments of the invention may also be implemented by means of software modules, which are executed by a processor or directly in hardware. Also a combination of software modules and a hardware implementation may be possible. The software modules may be stored on any kind of computer readable storage media, for example RAM, EPROM, EEPROM, flash memory, registers, hard disks, CD-ROM, DVD, etc.

Summarizing, the present invention relates to an efficient coding and modulation system for transmission of digital data over plastic optical fibres. In particular, the digital signal is coded by means of a three-level coset coding. The spectral efficiency of the system is configurable by means of selecting the number of bits to be processed in each of the levels. The first level applies to the digital data a binary BCH coding and performs coset partitioning by means of constellation mapping and lattice transformations. Similarly, second level applies another binary BCH coding, which may be performed selectably in accordance with the desired configuration by two BCH codes with substantially the same coding rate, operating on codewords of different sizes. The third level is uncoded. Both the second and third level undergo mapping and lattice transformation. After an addition of the levels, a second-stage lattice transformation is performed so as to obtain a zero-mean constellation. The symbols output from such three-level coset coder are then further modulated.

The invention claimed is:

1. A method for coding digital data for transmission over a plastic optical fibre, the method comprising the steps of:
    selecting the number of bits in a second and a third portion of input digital data as a function of a desired spectral efficiency;
    coding input digital data by a three-level coset coding including:
    separating from the input digital data a first portion, the second portion and the third portion of data, each with a predetermined number of bits;
    coding the first portion of data with a first Bose, Chaudhuri, Hocquenghem (BCH) code in a first level;
    providing in a second level a second BCH code and a third BCH code, wherein the third BCH code has a codeword length lower than the codeword length of the first and the second BCH code, and the third BCH code has substantially the same coderate as the second BCH code;
    coding the second portion with either the second or the third BCH code in the second level;
    in the first level, mapping the coded first portion onto symbols of a first QPSK constellation and performing a lattice transformation of the mapped symbols so as to achieve coset partitioning, wherein the lattice transformation includes translation and scaling;
    in the second level, mapping the coded second portion onto symbols of a second predefined constellation using QPSK or BPSK mapping depending on whether the second or third BCH code was used and performing a lattice transformation of the mapped symbols so as to achieve coset partitioning, the lattice transformation including translation, rotation by 45 degrees and scaling of the translated constellation when the number of bits per two dimensions of the second constellation is odd;

in the third level, mapping the third portion onto symbols of a third constellation over $Z^2$ or $RZ^2$ lattices, configured according to the desired spectral efficiency and performing a lattice transformation of the mapped symbols, the lattice transformation including translation, rotation of the translated constellation by 45 degrees when the number of bits per two dimensions of the configured constellation is odd, and scaling;

adding the transformed symbols from the first, the second and the third level resulting in a combined constellation over $Z^2$ or $RZ^2$;

performing a second stage lattice transformation of the combined constellation for achieving a zero-mean constellation, the second stage lattice transformation including rotation of the constellation by −45 degrees when the number of bits per two dimension of the combined constellation is odd and a modulo operation for constraining the symbols of the combined constellation to a square constellation over $Z^2$ or $RZ^2$; and modulating the symbols encoded with the three-level coset coding using a time-domain modulation.

2. The method according to claim 1, wherein the second and the third binary BCH codes have same primitive polynomial.

3. The method according to claim 1, further comprising a step of, based on desired spectral efficiency, selecting the number of bits per two dimensions of each level and adapt the lattice transformations by applying said rotation of the constellation when the number of bits per two dimension of the combined constellation is odd and not applying the rotation otherwise.

4. The method according to claim 1, wherein
the first BCH coder generates codewords with 2044 bits based on 1637 input information bits, and/or
the second BCH coder generates codewords with 2044 bits based on 2022 input information bits, and/or
the third BCH coder generates codewords with 1022 bits based on 1000 input information bits.

5. The method according to claim 1, wherein
the time-domain modulation is M-PAM and
the first-stage lattice transformation $\Lambda_1^r(l)$ is given by:

$$\Lambda_1^r(l)(x) = \Lambda_{1,2}^r(l)(\Lambda_{1,1}^r(l)(x))$$

with $$\Lambda_{1,2}^t(l)(x) = x \cdot 2^{\sum_{i=1}^{l-1} \lceil n_b(l) \rceil} \cdot \left(\frac{1+j}{2}\right)^{rem(2 \cdot n_b(l), 2)}$$

and $$\Lambda_{1,1}^r(l)(x) = \frac{1}{2}(x + (1+j)(2^{\lceil n_b(l) \rceil} - 1))$$

wherein I denotes the level, x is a complex number, nb(I) denotes number of bits per dimension in level I, $j = \sqrt{-1}$ and "rem" denotes a reminder after an integer division.

6. The method according to claim 1, further comprising a step of Tomlinson-Harashima precoding applied to the modulated symbols.

7. A method for receiving and decoding a digital signal encoded by the coding method according to claim 1 and received via a plastic optical fibre, the method comprising the steps of:

demodulating the encoded digital signal with a time-domain modulation to obtain symbol codewords and transforming them with an inverse lattice transformation, decoding the demodulated and transformed symbols with a three-stage decoder including the steps of:

extracting a first portion of a codeword by applying inverse lattice transformation, hard QPSK decision, and afterwards a modulo operation to a demodulated symbol;

decoding in a first stage the first portion with a first BCH decoder and based on the decoded first portion selecting a first coset;

extracting a second portion by applying inverse lattice transformation, hard QPSK or BPSK decision and afterwards a modulo operation to a symbol obtained by subtracting the decoded first portion from the demodulated symbol;

decoding in a second stage the second portion with a second or a third BCH decoder and based on the decoded second portion select a second coset;

obtaining a third portion by subtracting the decoded first and second cosets from the demodulated symbol, by applying inverse lattice transformation, hard $Z^2$ or $RZ^2$ decision and afterwards a modulo operation;

and multiplexing the decoded first, second and third portion, wherein on the second stage the second BCH code and the third BCH code are provided, wherein the third BCH code has a codeword length lower than the codeword length of the first and the second BCH code, and the third BCH code has substantially same coderate as the second BCH code.

8. An apparatus for coding digital data for transmission over a plastic optical fibre, the apparatus comprising:

a multi-level coset coder for coding input digital data by a three-level coset coding including:

a demultiplexer for separating from the input digital data a first portion, a second portion and a third portion of data, each with a predetermined number of bits selectable as a function of a desired spectral efficiency;

a first Bose, Chaudhuri, Hocquenghem (BCH) coder coding the first portion of data with a first BCH code in a first level;

a second BCH coder in a second level, wherein the second BCH coder is adapted to code the second portion with either a second or a third BCH code provided both in the second BCH coder, wherein the third BCH code has a codeword length lower than the codeword length of the first and the second BCH code, and the third BCH code has substantially the same coderate as the second BCH code;

a first mapper in the first level for mapping the coded first portion onto symbols of a first QPSK constellation and performing a lattice transformation of the mapped symbols so as to achieve coset partitioning, the lattice transformation including translation and scaling;

a second mapper in the second level for mapping the coded second portion onto symbols of a second predefined constellation using QPSK or BPSK mapping depending on whether the second or third BCH code was used and performing a lattice transformation of the mapped symbols so as to achieve coset partitioning, the lattice transformation including translation, rotation by 45 degrees and scaling of the translated constellation when the number of bits per two dimensions of the second constellation is odd;

a third mapper in the third level for mapping the third portion onto symbols of a third predefined constellation over $Z^2$ or $RZ^2$ lattices, configurable according to the desired spectral efficiency and performing a lattice transformation of the mapped symbols, the lattice transformation including translation, rotation of the translated constellation by 45 degrees when the number of bits per two dimensions of the configured constellation is odd, and scaling;

an adder for adding the transformed symbols from the first, the second and the third level resulting in a combined constellation over $Z^2$ or $RZ^2$, and a transformation unit for performing a second stage lattice transformation of the combined constellation so as to achieve a zero-mean constellation, the second stage lattice transformation including rotation of the constellation by −45 degrees when the number of bits per two dimension of the combined constellation is odd and a modulo operation for constraining the symbols of the combined constellation to a square constellation over $Z^2$ or $RZ^2$; and a modulator for modulating the symbols encoded with the three-level coset coding using a time-domain modulation.

9. The apparatus according to claim 8, wherein the second and the third binary BCH codes have the same primitive polynomial.

10. The apparatus according to claim 8, further comprising a selector for, based on desired spectral efficiency, selecting the number of bits per two dimensions of each level and adapt the lattice transformations by applying said rotation of the constellation when the number of bits per two dimension of the combined constellation is odd and not applying the rotation otherwise.

11. The apparatus according to claim 8, wherein
the first BCH coder generates codewords with 2044 bits based on 1637 input information bits, and/or
the second BCH coder generates codewords with 2044 bits based on 2022 input information bits, and
the third BCH coder generates codewords with 1022 bits based on 1000 input information bits.

12. The apparatus according to claim 8, wherein the first, the second, and/or the third mapper is configured to apply the first-stage lattice transformation $\Lambda_1{}^t(l)$ given by:

$$\kappa_1{}^t(l)(x) = \Lambda_{1,2}{}^t(l)(\Lambda_{1,1}{}^t(l)(x))$$

with $$\Lambda_{1,2}^t(l)(x) = x \cdot 2^{\sum_{i=1}^{l-1} \lceil n_b(l) \rceil} \cdot \left(\frac{1+j}{2}\right)^{rem(2 \cdot n_b(l), 2)}$$

and $$\Lambda_{1,1}{}^t(l)(x) = \frac{1}{2}(x + (1+j)(2^{\lceil n_b(l) \rceil} - 1))$$

wherein I denotes the level, x is a complex number, nb(I) denotes number of bits per dimension in level I, $j=\sqrt{-1}$ and "rem" denotes a reminder after an integer division, and the modulator is an M-PAM modulator.

13. The method according to any of claim 8, further comprising a Tomlinson-Harashima precoder for precoding the symbols modulated by the modulator.

14. An apparatus for receiving and decoding a digital signal encoded with an apparatus according to claim 8 and received via a plastic optical fibre, the apparatus comprising:

a demodulator for demodulating the encoded digital signal with a time-domain modulation to obtain symbol codewords, a transform unit for transforming the demodulated symbols with an inverse lattice transformation;

a multi-stage decoder for decoding the demodulated and transformed symbols, the multi-stage decoder having three stages and further comprising:

a first extractor for extracting a first portion of a codeword by applying an inverse lattice, hard QPSK decision, and afterwards a transformation and a modulo operation to a demodulated symbol;

a first BCH decoder for decoding in a first stage the first portion and based on the decoded first portion selecting a first coset;

a second extractor for extracting a second portion by applying an inverse lattice transformation, hard QPSK or BPSK decision and afterwards a modulo operation to a symbol obtained by subtracting the decoded first portion from the demodulated symbol;

a second and a third BCH decoder on a second stage applying a respective second BCH code and third BCH code, wherein the third BCH code has a codeword length lower than the codeword length of the first and the second BCH code, and the third BCH code has substantially the same coderate as the second BCH code;

a decoder for decoding in a second stage the second portion with the second or the third BCH decoder and based on the decoded second portion select a second coset;

a third extractor for obtaining a third portion by subtracting the decoded first and second cosets from the demodulated symbol, applying an inverse lattice transformation, hard $Z^2$ or $RZ^2$ decision and afterwards a modulo operation; and a multiplexer for multiplexing the decoded first, second and third portion.

15. An integrated circuit embodying the apparatus according to claim 8.

* * * * *